(12) United States Patent
Yokoyama et al.

(10) Patent No.: US 8,486,736 B2
(45) Date of Patent: Jul. 16, 2013

(54) METHOD FOR MANUFACTURING LIGHT-EMITTING DEVICE

(75) Inventors: Kohei Yokoyama, Kanagawa (JP); Koichiro Tanaka, Kanagawa (JP); Hisao Ikeda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 929 days.

(21) Appl. No.: 12/579,067

(22) Filed: Oct. 14, 2009

(65) Prior Publication Data

US 2010/0098879 A1   Apr. 22, 2010

(30) Foreign Application Priority Data

Oct. 20, 2008   (JP) ................. 2008-270293

(51) Int. Cl.
*H01L 21/00* (2006.01)

(52) U.S. Cl.
USPC ................. 438/29; 438/34; 438/46

(58) Field of Classification Search
USPC .......... 438/29, 30, 34, 35, 39, 46, 47
See application file for complete search history.

(56) References Cited

U.S. PATENT DOCUMENTS

| | | | |
|---|---|---|---|
| 5,851,709 A | 12/1998 | Grande et al. | |
| 5,937,272 A | 8/1999 | Tang | |
| 6,165,543 A | 12/2000 | Otsuki et al. | |
| 6,283,060 B1 | 9/2001 | Yamazaki et al. | |
| 6,566,032 B1 | 5/2003 | Boroson et al. | |
| 6,610,455 B1 | 8/2003 | Burberry et al. | |
| 6,689,492 B1 | 2/2004 | Yamazaki et al. | |
| 6,695,029 B2 | 2/2004 | Phillips et al. | |
| 6,703,179 B2 | 3/2004 | Tyan | |
| 6,776,847 B2 | 8/2004 | Yamazaki et al. | |
| 6,811,938 B2 | 11/2004 | Tutt et al. | |
| 7,316,983 B2 | 1/2008 | Yamazaki et al. | |
| 7,887,987 B2 * | 2/2011 | Matsuo | 430/200 |
| 7,932,112 B2 | 4/2011 | Yokoyama et al. | |
| 2004/0065902 A1 | 4/2004 | Yamazaki et al. | |
| 2004/0191564 A1 | 9/2004 | Kim et al. | |
| 2005/0005848 A1 | 1/2005 | Yamazaki et al. | |
| 2005/0145326 A1 | 7/2005 | Hatwar | |
| 2006/0243377 A1 | 11/2006 | Matsuo et al. | |
| 2006/0246240 A1 | 11/2006 | Matsuda et al. | |
| 2008/0050851 A1 | 2/2008 | Tanaka et al. | |
| 2008/0050895 A1 | 2/2008 | Miyairi et al. | |
| 2008/0057632 A1 | 3/2008 | Arai et al. | |
| 2008/0081115 A1 | 4/2008 | Yamazaki et al. | |

(Continued)

FOREIGN PATENT DOCUMENTS

| | | |
|---|---|---|
| EP | 1 176 642 A2 | 1/2002 |
| EP | 1 335 637 A1 | 8/2003 |

(Continued)

*Primary Examiner* — Kevin M Picardat
(74) *Attorney, Agent, or Firm* — Husch Blackwell LLP

(57) ABSTRACT

A method for manufacturing a light-emitting device is provided, which includes a step of forming a light-absorbing layer including an unevenness portion over a first substrate, a step of forming a first organic compound layer over the light-absorbing layer, a step of providing a second substrate over the first substrate with the light-absorbing layer and the first organic compound layer interposed therebetween, and a step of irradiating the light-absorbing layer with light to deposit a second organic compound layer including a material contained in the first organic compound layer onto the second substrate.

19 Claims, 16 Drawing Sheets

U.S. PATENT DOCUMENTS

| | | |
|---|---|---|
| 2008/0113292 A1 | 5/2008 | Matsuo |
| 2008/0124850 A1 | 5/2008 | Takayama et al. |
| 2008/0182349 A1 | 7/2008 | Yamazaki et al. |
| 2008/0227232 A1 | 9/2008 | Yamazaki et al. |
| 2008/0299496 A1 | 12/2008 | Hirakata et al. |
| 2009/0075214 A1 | 3/2009 | Hirakata et al. |
| 2009/0104403 A1 | 4/2009 | Aoyama et al. |
| 2009/0104835 A1 | 4/2009 | Aoyama et al. |
| 2009/0142510 A1 | 6/2009 | Takahashi et al. |
| 2009/0166563 A1 | 7/2009 | Yokoyama et al. |
| 2009/0169809 A1 | 7/2009 | Yokoyama et al. |
| 2009/0197017 A1 | 8/2009 | Tanaka et al. |
| 2009/0269509 A1 | 10/2009 | Yokoyama et al. |
| 2010/0015424 A1 | 1/2010 | Seo et al. |
| 2011/0193124 A1 | 8/2011 | Yokoyama et al. |

FOREIGN PATENT DOCUMENTS

| | | |
|---|---|---|
| EP | 1 344 652 A2 | 9/2003 |
| JP | 2000-256877 | 9/2000 |
| JP | 2002-359075 | 12/2002 |
| JP | 2003-308974 | 10/2003 |
| JP | 2004-103406 | 4/2004 |
| JP | 2006-228649 | 8/2006 |
| JP | 2007-141702 | 6/2007 |
| JP | 2008-66147 | 3/2008 |

\* cited by examiner 101a 104a 150a 101d 104d 150d 101e 104e 150e

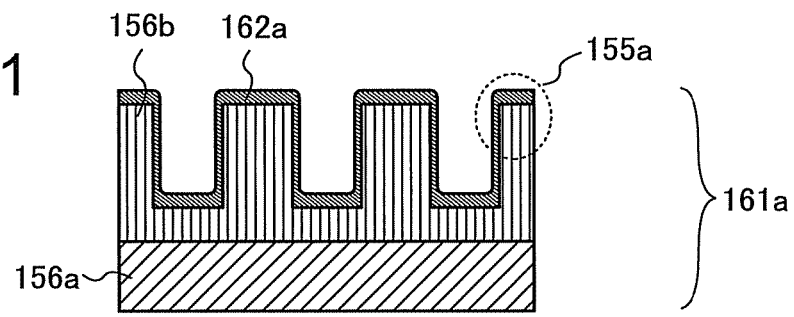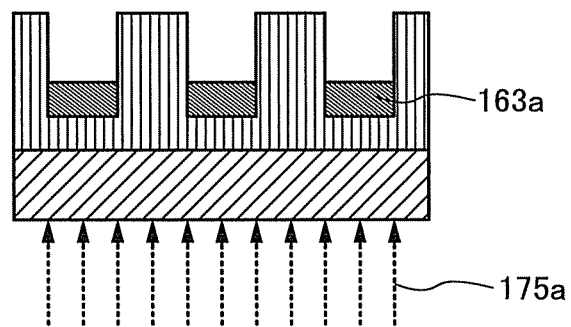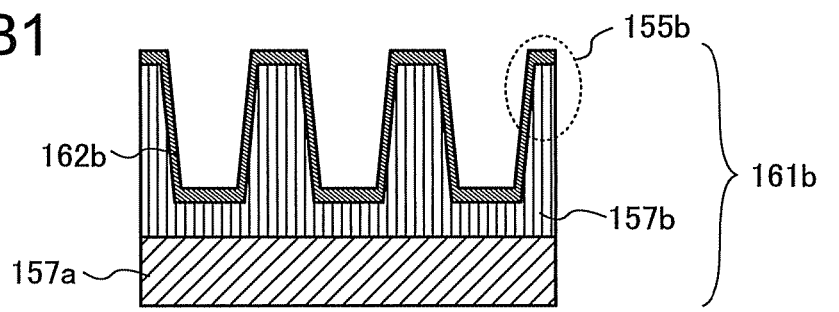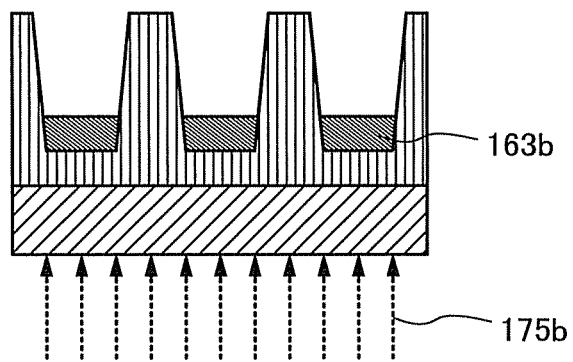

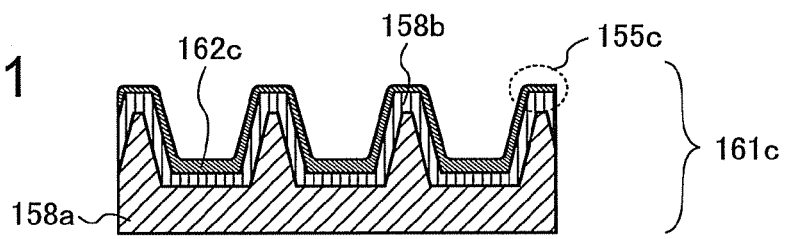
FIG.6A1
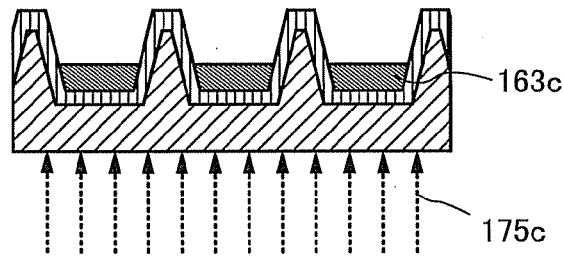
FIG.6A2
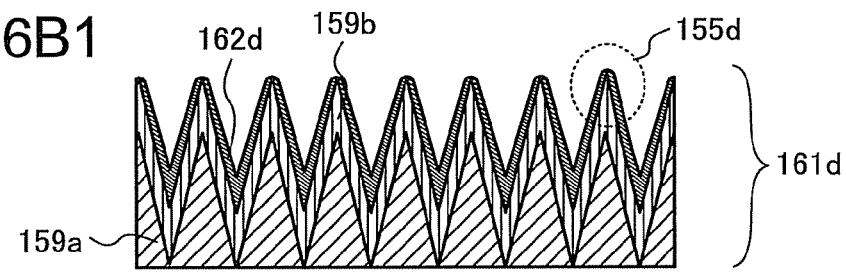
FIG.6B1
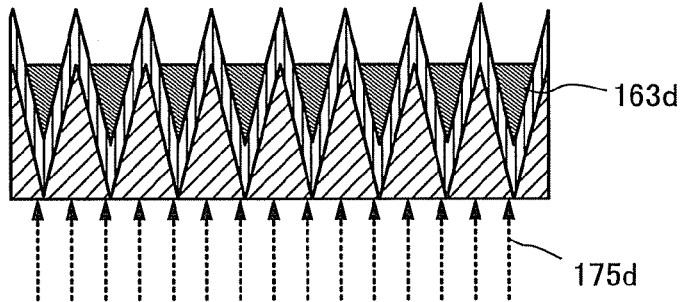
FIG.6B2

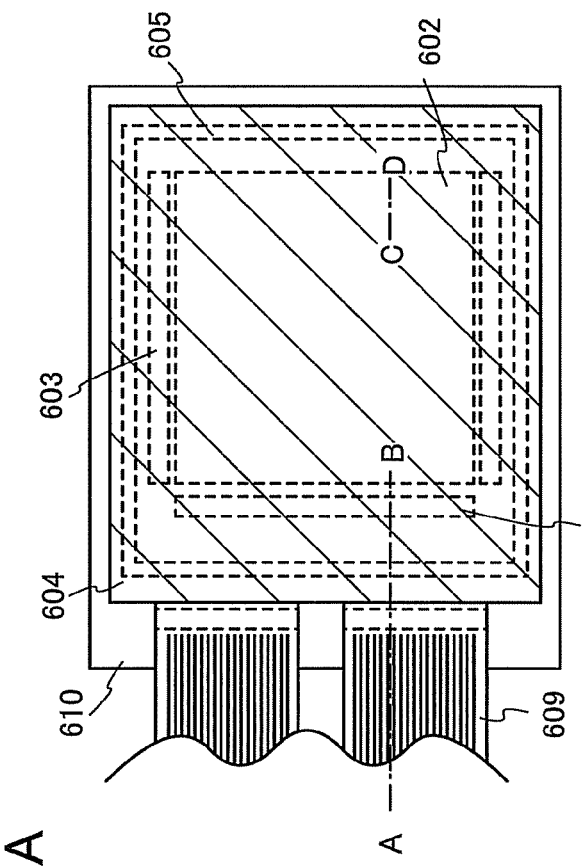
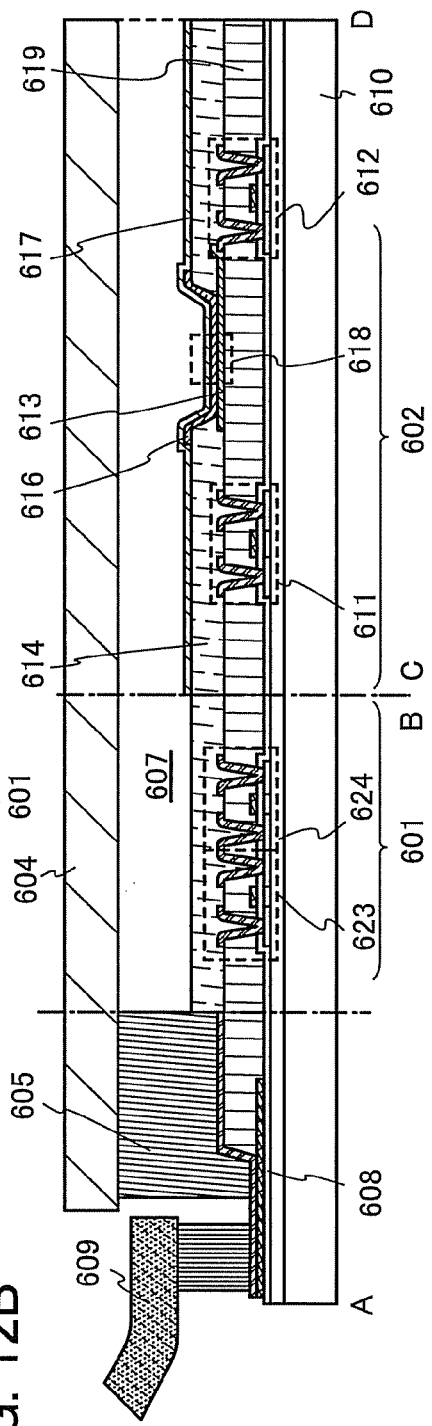
FIG. 12A
FIG. 12B

METHOD FOR MANUFACTURING LIGHT-EMITTING DEVICE

BACKGROUND OF THE INVENTION

1. Field of the Invention

It relates to a deposition substrate, a deposition method, and a method for manufacturing a light-emitting device.

2. Description of the Related Art

In a light-emitting device provided with an electroluminescent (hereinafter also referred to as EL) element, a color light-emitting element that emits color light is used to perform full-color display. In order to form the color light-emitting element, a light-emitting material of each color needs to be formed in a fine pattern on an electrode.

In general, light-emitting materials are deposited by an evaporation method, which has problems in that a material-use efficiency is low, the size of a substrate is limited, and so on, and thus is not suitable for industrialization that requires high productivity and low cost.

As a technique for solving the aforementioned problem, a method has been proposed in which a light-emitting layer is formed by transferring a light-emitting material from a donor substrate having an organic donor layer to an element-formation substrate by using light emitted from a laser or a flash lamp (for example, see Reference 1).

[Reference 1]
Japanese Published Patent Application No. 2003-308974

However, the above transfer method has problems such as a nonuniform thickness and poor film quality of a light-emitting layer deposited onto an element-formation substrate. These problems lead to reduction in reliability and yield of a light-emitting device. Therefore, a deposition method by which a film having a uniform thickness and good film quality can be deposited is expected.

In view of the above problems, it is an object to deposit a film having a uniform thickness and good film quality by a thermal deposition method using light.

It is another object to perform light irradiation with lower energy by efficiently supplying energy of light to a material.

It is another object to provide a technique by which highly reliable light-emitting devices can be manufactured with high productivity.

SUMMARY OF THE INVENTION

A deposition substrate in which a light-absorbing portion and an organic compound-containing layer are formed over a light-transmitting substrate is irradiated with light and the light is made to pass through the light-transmitting substrate to irradiate the light-absorbing portion with the light, whereby a material contained in the organic compound-containing layer is deposited onto a deposition-target substrate which is placed so as to face the deposition substrate. As means for heating the material contained in the organic compound-containing layer, a light irradiation means is used.

In the case of depositing a film by a thermal deposition method using light, the material sublimes, so that the pressure in a chamber is increased. Therefore, the temperature of the material becomes higher than the melting point, and the material contained in the organic compound-containing layer is liquefied and locally flocculated over an absorbing layer, leading to a nonuniform thickness of a film deposited.

To solve such problems, in a thermal deposition method using light, a rough surface with unevenness (a matted surface) is used as a surface of a light-absorbing portion of a deposition substrate over which a material layer to be deposited (an organic compound-containing layer) is provided. Since the organic compound material melted by heating using light is over the rough surface, the material is not flocculated. Thus, a film can be deposited to a uniform thickness onto a deposition-target substrate.

A surface of a light-absorbing portion is provided with projections, so that the surface has unevenness. Such a surface having an uneven shape is also referred to as a matted surface. The light-absorbing portion may have a single-layer structure or a stacked-layer structure.

In the case where the light-absorbing portion has a stacked-layer structure, a light-absorbing film and a film with projections may be stacked from the first substrate side, or a film with projections and a light-absorbing film may be stacked from the first substrate side.

In the light-absorbing portion, a film formed in an upper layer may be processed so that the film has unevenness, or a film formed in a lower layer may be processed so that the film has unevenness and the unevenness of the film in the lower layer is reflected in a surface of a film formed in an upper layer.

In the case where the light-absorbing portion has a stacked-layer structure, it is acceptable as long as at least one layer is a light-absorbing film which absorbs light and supplies heat. As a film other than the light-absorbing film, a film with a light-transmitting property is used in the case of being provided in a layer lower than the light-absorbing film, or a film with a high thermal conductivity which does not block heat is used in the case of being provided in a layer upper than the light-absorbing film.

Therefore, as a film other than the light-absorbing film, a film with a low thermal conductivity may be used (a film with a low thermal conductivity is preferable) in the case of being provided in a layer lower than the light-absorbing film, and a film without a light-transmitting property may be used in the case of being provided in a layer upper than the light-absorbing film.

The shape of the projections is not particularly limited as long as unevenness can be faulted on the surface of the light-absorbing portion. The shape may be a column-like shape, a cone-like shape, a lattice-like shape, or the like. Further, the unevenness can be provided in the form of continuous stripes, discontinuous dots, or the like. The difference in height between a depression and the projection (the surface height of the projection) in the light-absorbing portion is preferably from 50 nm to 2 μm, more preferably from 500 nm to 2 μm. In this specification, the difference in height between the depression and the projection of the light-absorbing portion is preferably in the range of the difference in height between the depression and the projection of a film, which is a material layer, over the outermost surface of the deposition substrate.

When the light-absorbing portion is selectively formed by reflecting a deposition pattern, a thin film can be deposited in the pattern onto a deposition-target substrate.

A reflective layer may be selectively formed between the light-transmitting substrate and the light-absorbing portion so that the light-absorbing portion can be prevented from being irradiated with light. Light is reflected by the reflective layer; therefore, a thin film that reflects a pattern of the reflective layer can be deposited onto the deposition-target substrate.

Further, a heat-insulating layer which blocks heat conduction may be provided between a reflective layer and an organic compound-containing layer. It is preferable that the heat-insulating layer have a light transmittance of 60% or more and be formed using a material having a lower thermal conductivity than materials used for the reflective layer and the light-absorbing portion. With a low thermal conductivity, heat generated from emitted light can be efficiently used for deposition.

One embodiment of a deposition substrate includes a light-absorbing portion with unevenness and an organic compound-containing layer over the light-absorbing portion with unevenness. The organic compound-containing layer is formed by reflecting the unevenness.

Another embodiment of a deposition substrate includes a light-absorbing portion with unevenness and an organic compound-containing layer over the light-absorbing portion with unevenness. The light-absorbing portion has a stacked-layer structure including a light-absorbing film and a light-transmitting film; a surface of the light-transmitting film is provided with the unevenness; and the organic compound-containing layer is formed by reflecting the unevenness.

Another embodiment of a deposition substrate includes a light-absorbing portion with unevenness and an organic compound-containing layer over the light-absorbing portion with unevenness. The light-absorbing portion has a stacked-layer structure including a light-absorbing film and a light-transmitting film; a surface of the light-transmitting film is provided with the unevenness; a surface of the light-absorbing film reflects the unevenness of the light-transmitting film; and the organic compound-containing layer is formed by reflecting the unevenness.

One embodiment of a deposition method includes the steps of: using a deposition substrate which includes a light-absorbing portion with unevenness and an organic compound-containing layer over the light-absorbing portion with unevenness, the organic compound-containing layer being formed by reflecting the unevenness; placing the deposition substrate and a deposition-target substrate such that a surface of the deposition substrate where the organic compound-containing layer is formed and the deposition-target substrate face each other; and irradiating the light-absorbing portion with light passing through the light-transmitting substrate to deposit a material contained in the organic compound-containing layer over the light-absorbing portion irradiated with the light onto the deposition-target substrate.

With the use of the deposition substrate and the deposition method, a light-emitting layer can be formed onto a first electrode layer provided on the deposition-target substrate, and a second electrode layer can be formed onto the light-emitting layer. Thus, a light-emitting device having a light-emitting element can be manufactured. In the case where a light-emitting layer is formed, a deposition-target region may be made to correspond to one pixel, or a deposition-target region may be made to correspond to a plurality of pixels to manufacture light-emitting layers of the plurality of pixels at a time.

A thin film can be formed in a fine pattern onto a deposition-target substrate without providing a mask between an evaporation material and the deposition-target substrate.

The step of irradiating the light-absorbing portion with light is preferably performed in a reduced pressure. When light is emitted in a reduced pressure so that a material is deposited onto the deposition-target substrate, the effect of contaminants such as dust on a deposited film can be reduced.

Since a large area can be processed, a thin film can be formed with high productivity even on a deposition-target substrate having a large area. Thus, a highly reliable light-emitting device and a highly reliable electronic device can be manufactured at low cost.

A thin film having a uniform thickness and good film quality can be deposited onto a deposition-target substrate without providing a mask between an evaporation material and the deposition-target substrate.

By a thermal deposition method using light, a film having a uniform thickness and good film quality can be deposited.

The energy of light can be efficiently supplied to a material and thus light irradiation can be performed with lower energy.

Moreover, a highly reliable light-emitting device can be manufactured using such a deposition substrate and such a deposition method. Furthermore, a thin film can be formed onto a large deposition-target substrate; therefore, a large light-emitting device and electronic device can be manufactured.

BRIEF DESCRIPTION OF THE DRAWINGS

FIGS. 5A1, 5A2, 5B1, and 5B2 are cross-sectional views of examples of a deposition substrate.

FIGS. 6A1, 6A2, 6B1, and 6B2 are cross-sectional views of examples of a deposition substrate.

FIGS. 12A and 12B are a top view and a cross-sectional view illustrating a light-emitting display module.

DETAILED DESCRIPTION OF THE INVENTION

Figure 1A:
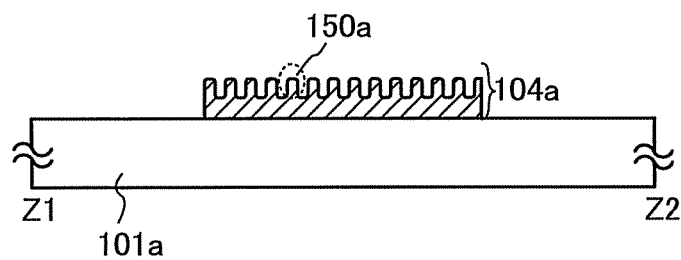
FIGS. 1A to 1C are cross-sectional views of examples of a deposition substrate.

Embodiments will be described below with reference to drawings. However, the present invention can be implemented in various different modes, and it is easily understood by those skilled in the art that various changes and modifications of the modes and details are possible without departing from the purpose and scope of the present invention. Therefore, the present invention is not construed as being limited to the description of the embodiments. Note that the same portion or a portion having the same function is denoted by the same reference numeral in all drawings for explaining embodiments, and the repetitive explanation thereof is omitted.

Embodiment 1

In this embodiment, examples of a deposition substrate and a deposition method will be described with reference to FIGS. 1A to 1C, FIGS. 2A to 2C, FIGS. 3A to 3E, FIGS. 4A to 4D, and FIGS. 5A1, 5A2, 5B1, and 5B2, which are intended to form a thin film having a uniform thickness and good quality over a deposition-target substrate.

FIG. 1A illustrates an example of a deposition substrate. A light-absorbing portion 104a is selectively formed over a first substrate 101a. An insulating film which serves as a base film may be formed between the first substrate 101a and the light-absorbing portion 104a.

A surface of the light-absorbing portion 104a is provided with projections 150a, so that the surface has unevenness. Such an uneven surface is also referred to as a matted surface. FIG. 1A illustrates a structure in which the light-absorbing portion 104a has a single-layer structure and the surface of the light-absorbing portion 104a is provided with the projections 150a. In this specification, an absorbing property, a transmitting property, and a blocking property of a material for a deposition substrate are properties with respect to light emitted.

Figure 1B:
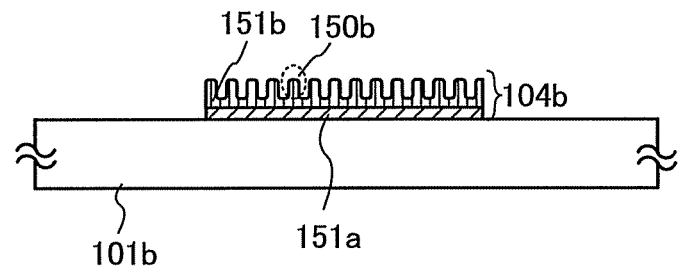

FIG. 1B illustrates an example in which a light-absorbing portion has a stacked-layer structure, and a light-absorbing portion 104b having a stacked-layer structure including a light-absorbing film 151a and a film 151b with projections 150b is formed over a first substrate 101b. Any material may be used for the film 151b with the projections 150b as long as it is not a material which blocks heat to be supplied from the light-absorbing film 151a, and it may have either a light-absorbing property or a light-transmitting property.

Figure 1C:
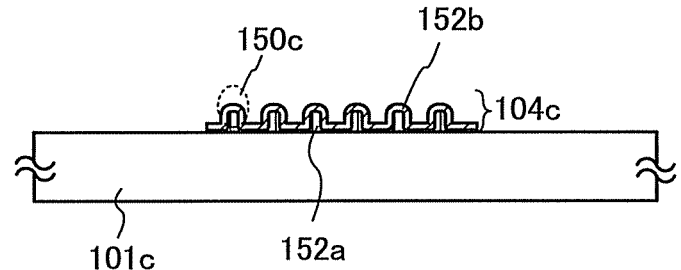

FIG. 1B illustrates an example in which processing is performed such that a film formed in an upper layer of the light-absorbing portion 104b has unevenness. Meanwhile, FIG. 1C illustrates an example in which a film in a lower layer has unevenness and the unevenness of the film in the lower layer is reflected in a surface of a film formed in an upper layer. In FIG. 1C, a light-absorbing portion 104c with projections 150c is provided over a first substrate 101c, and the light-absorbing portion 104c includes a film 152a with unevenness and a light-absorbing film 152b formed over the film 152a with unevenness. The surface of the light-absorbing film 152b has unevenness by reflecting the shape of the film 152a with unevenness in a lower layer.

In the case where the light-absorbing portion has a stacked-layer structure, it is acceptable as long as at least one layer is a light-absorbing film which absorbs light and supplies heat. As a film other than the light-absorbing film, a film with a light-transmitting property is used in the case of being provided in a layer lower than the light-absorbing film, or a film with a high thermal conductivity which does not block heat is used in the case of being provided in a layer upper than the light-absorbing film.

It is necessary that the light-absorbing film be a continuous film covering a thin film formation region of a deposition-target substrate. However, another film included in the light-absorbing portion may be a discontinuous film. For example, in order to form unevenness, column- or cone-like projections may be arranged and a light-absorbing film may be formed over or under the projections. In the case of stacking a plurality of light-absorbing films, a structure may be used in which a plurality of continuous light-absorbing films cover a thin film formation region of a deposition-target substrate.

Figure 4A:
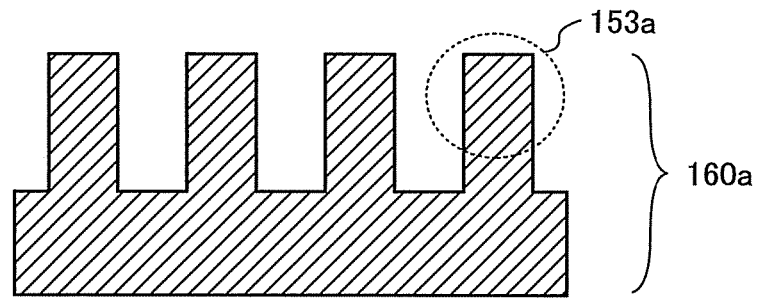
FIGS. 4A to 4D are cross-sectional views of examples of a deposition substrate.
Figure 4B:
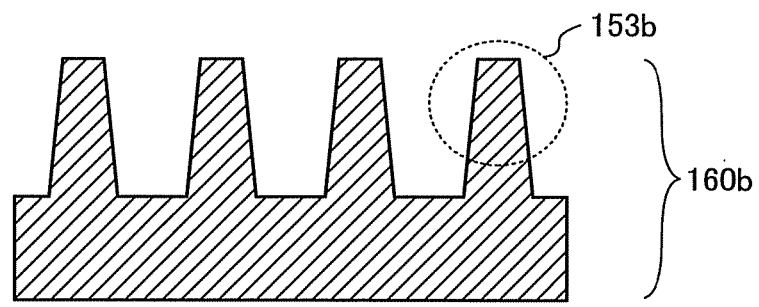
Figure 4C:
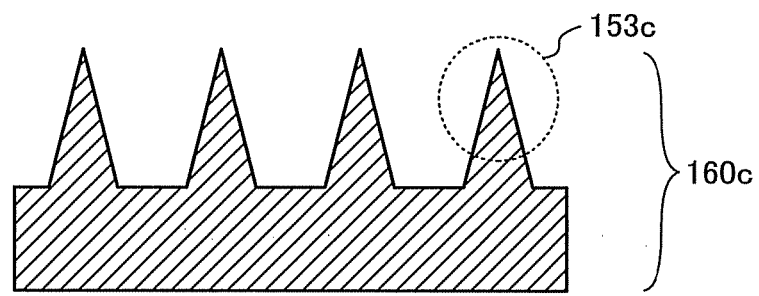
Figure 4D:
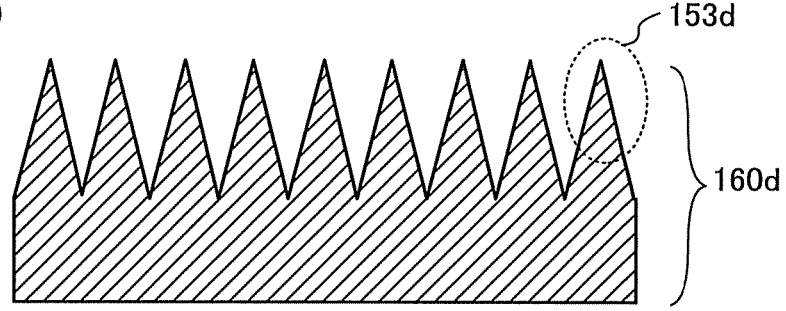

FIGS. 4A to 4D illustrate examples of the shape of the projections. Each of FIGS. 4A to 4D is a cross-sectional view cut along a plane in a light-absorbing portion with projections. FIG. 4A illustrates a light-absorbing portion 160a with a plurality of column-like projections 153a. FIG. 4B illustrates a light-absorbing portion 160b with a plurality of trapezoid-like projections 153b which are upwardly tapered. The projections may have cone-like shapes. FIG. 4C is a light-absorbing portion 160c with a plurality of spaced cone-like projections 153c. FIG. 4D is a light-absorbing portion 160d with a plurality of cone-like projections 153d which are adjacent to each other so that a bottom face of a cone-like projection is in contact with an adjacent bottom face of another cone-like projection. FIGS. 4A to 4D illustrate examples of providing a plurality of projections having the same shape. However, a plurality of projections having different shapes may be provided, so that unevenness can be formed on a surface of the light-absorbing portion.

Note that FIGS. 4A to 4D are cross-sectional views each of which is two-dimensional and is obtained by cutting a light-absorbing portion along a plane. When three-dimensionally seen, the unevenness in the light-absorbing portion may be provided in the form of continuous stripes as illustrated in FIG. 2B or may be provided in the form of discontinuous dots as illustrated in FIG. 2A.

Note that in the case where the projections are spaced as illustrated in FIGS. 4A to 4C, the space (the distance between the projections) may be approximately from 300 nm to 2 µm.

Figure 2A:
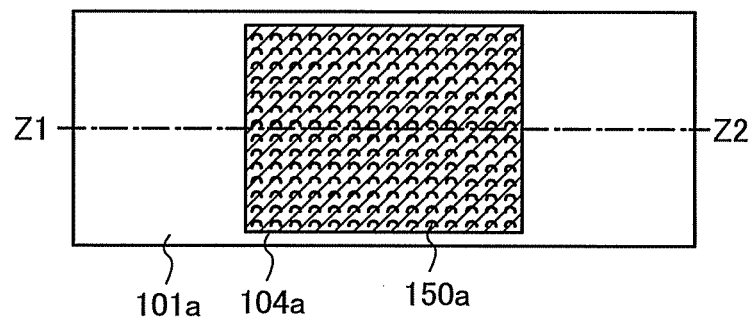
FIGS. 2A to 2C are plan views of examples of a deposition substrate.
Figure 2B:
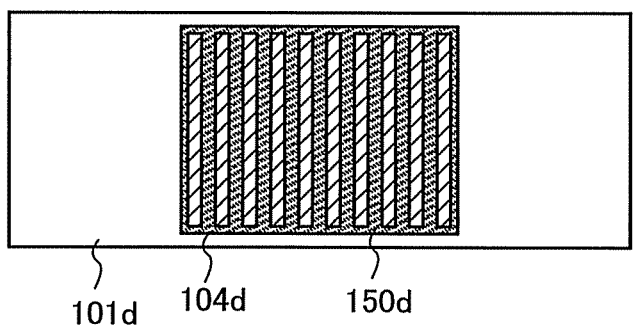
Figure 2C:
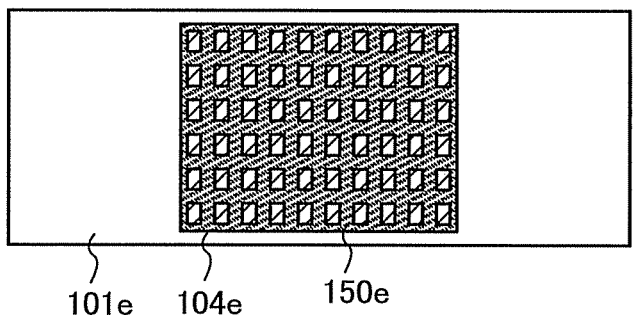

FIGS. 2A to 2C are plan views of deposition substrates. FIG. 1A corresponds to a cross-sectional view taken along line Z1-Z2 in FIG. 2A.

In FIG. 2A, a plurality of projections 150a are arranged on a surface of the light-absorbing portion 104a provided over the first substrate 101a.

The projection of the unevenness may be a rectangular solid or may have a lattice-like shape. In FIGS. 2B and 2C, a hatch region indicated by dotted lines corresponds to a projection region. In FIG. 2B, projections 150d which form depressions in the form of stripes are formed on a surface of the light-absorbing portion 104d provided over a first substrate 101d. In FIG. 2C, projections 150e having a lattice-like shape are formed on a surface of a light-absorbing portion 104e provided over a first substrate 101e.

When an organic compound-containing layer, which is a material layer formed over a light-absorbing portion, is melted by heating due to light irradiation, the layer flows into a plurality of minute depressions. The unevenness provided on the surface of the light-absorbing portion has an effect of preventing the material from being locally flocculated on the surface of the light-absorbing portion.

Examples in which an organic compound-containing layer provided over a light-absorbing portion with unevenness is melted are described with reference to FIGS. 5A1, 5A2, 5B1, and 5B2 and FIGS. 6A1, 6A2, 6B1, and 6B2. In FIGS. 5A1, 5A2, 5B1, and 5B2 and FIGS. 6A1, 6A2, 6B1, and 6B2, A1 and B1 illustrate a deposition-target substrate which is not yet irradiated with light, and A2 and B2 illustrate a deposition substrate which has been irradiated with light.

In FIG. 5A1, a light-absorbing portion 161a includes a flat light-absorbing film 156a and a film 156b with column-like projections 155a, and an organic compound-containing layer 162a is formed over the unevenness. By irradiation with light 175a, heat is supplied to the organic compound-containing layer 162a in the light-absorbing portion 161a to melt the organic compound-containing layer 162a, and a melted organic compound material 163a flows into depressions of the light-absorbing portion 161a as illustrated in FIG. 5A2.

Similarly, in FIG. 5B1, a light-absorbing portion 161b includes a flat light-absorbing film 157a and a film 157b with projections 155b having trapezoid-like cross sections, and an organic compound-containing layer 162b is formed over the unevenness. By irradiation with light 175b, heat is supplied to the organic compound-containing layer 162b in the light-absorbing portion 161b to melt the organic compound-containing layer 162b, and a melted organic compound material 163b flows into depressions of the light-absorbing portion 161b as illustrated in FIG. 5B2.

In FIG. 6A1, a light-absorbing portion 161c with cone-like projections 155c includes a film 158a with projections and a light-absorbing film 158b, and an organic compound-containing layer 162c is formed over the unevenness. By irradiation with light 175c, heat is supplied to the organic compound-containing layer 162c in the light-absorbing portion 161c to melt the organic compound-containing layer 162c, and a melted organic compound material 163c flows into depressions of the light-absorbing portion 161c as illustrated in FIG. 6A2.

Similarly, in FIG. 6B1, a light-absorbing portion 161d with cone-like projections 155d includes a film 159a with projections and a light-absorbing film 159b, and an organic compound-containing layer 162d is formed over the unevenness. By irradiation with light 175d, heat is supplied to the organic compound-containing layer 162d in the light-absorbing portion 161d to melt the organic compound-containing layer 162d, and a melted organic compound material 163d flows into depressions of the light-absorbing portion 161d as illustrated in FIG. 6B2.

When a structure in which a light-absorbing film is stacked over a film with projections is used as with the light-absorbing portion 161c and the light-absorbing portion 161d in FIGS. 6A1, 6A2, 6B1, and 6B2, the film with projections functions as an antireflective film with respect to the light 175c or the light 175d. Therefore, efficiency of conversion of light into heat can be enhanced. Thus, light irradiation can be performed with lower energy.

A deposition method using the deposition substrate illustrated in FIG. 1A is described with reference to FIGS. 3A to 3E. A deposition substrate illustrated in FIG. 3A corresponds to the deposition substrate illustrated in FIG. 1A.

A film is deposited onto a deposition-target substrate by irradiating the light-absorbing portion 104a formed in the deposition substrate with light from the first substrate 101a side. Therefore, with respect to the light, the first substrate 101a needs to have a light-transmitting property and the light-absorbing portion 104a needs to have a light-absorbing property. Accordingly, the kinds of materials suitable for the first substrate 101a and the light-absorbing portion 104a vary depending on the wavelength of emitted light, and thus the materials need to be selected as appropriate.

In addition, the first substrate 101a is preferably formed using a material having a low thermal conductivity. With a low thermal conductivity, heat generated from emitted light can be efficiently used for deposition. As the first substrate 101a, for example, a glass substrate, a quartz substrate, or a plastic substrate containing an inorganic material can be used. As the glass substrate, it is possible to use any of a variety of so-called non-alkali glass substrates used in the electronics industry, such as an aluminosilicate glass substrate, an aluminoborosilicate glass substrate, and a barium borosilicate glass substrate.

The light-absorbing portion 104a is a layer that absorbs light emitted during deposition. Therefore, the light-absorbing portion 104a needs to have a light-absorbing film, and the light-absorbing film is preferably formed using a material that has a low reflectivity and a high absorptance with respect to the emitted light. Specifically, it is preferable that the light-absorbing portion 104a have a reflectivity of 70% or less with respect to the emitted light.

Various kinds of materials can be used for the light-absorbing film of the light-absorbing portion 104a. For example, a metal nitride such as titanium nitride, tantalum nitride, molybdenum nitride, or tungsten nitride, a metal such as titanium, molybdenum, or tungsten, or carbon can be used. Note that the kind of materials suitable for the light-absorbing portion 104a varies depending on the wavelength of emitted light, and thus the materials need to be selected as appropriate. In addition, the structure of the light-absorbing film is not limited to a single layer and may include a plurality of layers. For example, the light-absorbing film may have a stacked-layer structure including metal and metal nitride. In the case where the light-absorbing portion has a stacked-layer structure of light-absorbing films, by stacking light-absorbing films using materials with different light absorption wavelengths, a region of light absorption wavelengths is enlarged in the light-absorbing portion. Therefore, light use efficiency can be enhanced.

As a film other than the light-absorbing film included in the light-absorbing portion 104a, a film with a light-transmitting property is used in the case of being provided in a layer lower than the light-absorbing film, or a film with a high thermal conductivity which does not block heat is used in the case of being provided in a layer upper than the light-absorbing film. Therefore, as the film other than the light-absorbing film, a film with a low thermal conductivity (a film with a low thermal conductivity is preferable) may be used in the case of being provided in a layer lower than the light-absorbing film, and a film without a light-transmitting property may be used in the case of being provided in a layer upper than the light-absorbing film.

For example, as the film formed in the layer upper than the light-absorbing film, a silicon nitride film, a silicon nitride oxide film, or the like can be used. As the film formed in the layer lower than the light-absorbing film, a silicon nitride film, a silicon nitride oxide film, a silicon oxide film, an aluminum oxide film, or the like can be used. Preferably, a silicon nitride film can be used as the film formed in the layer upper than the light-absorbing film, and a silicon oxide film can be used as the film formed in the layer lower than the light-absorbing film.

The light-absorbing portion 104a can be formed by a variety of methods. For example, the layer can be formed by sputtering, electron beam evaporation, vacuum evaporation, chemical vapor deposition (CVD), or the like.

The thickness of each of the light-absorbing portion 104a, which depends on a material, is preferably large enough to prevent transmission of emitted light. Specifically, the light-absorbing portion 104a preferably has a thickness from 10 nm to 2 μm. In addition, it is more preferable that the light absorption portion have a thickness from 10 nm to 600 nm because deposition can be performed using light with a lower energy when the light absorption portion has a smaller thickness. For example, in the case of emitting light having a wavelength of 532 nm, the light-absorbing layer 104a with a thickness from 50 nm to 200 nm can efficiently absorb the emitted light to generate heat. Furthermore, the light-absorbing portion 104a with a thickness from 50 nm to 200 nm allows highly accurate deposition on the deposition-target substrate.

The difference in height between the depression and the projection of the light-absorbing portion 104a is preferably from 50 nm to 2 μm, more preferably from 500 nm to 2 μm. Further, in the cross section of the light-absorbing portion 104a, the distance between the depression and the projection may be approximately from 300 nm to 2 μm.

The light-absorbing portion 104a may partially transmit the emitted light as long as a material contained in an organic compound-containing layer 105 can be heated to the deposition temperature (the temperature at which at least part of the material contained in the material layer is deposited onto the deposition-target substrate). Note that when the light-absorbing portion 104a partially transmits the emitted light, the material contained in the organic compound-containing layer 105 needs to be a material that is not decomposed by light.

Figure 3A:
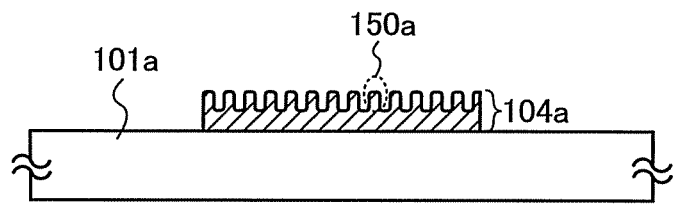
FIGS. 3A to 3E are views illustrating a deposition method.
Figure 3B:
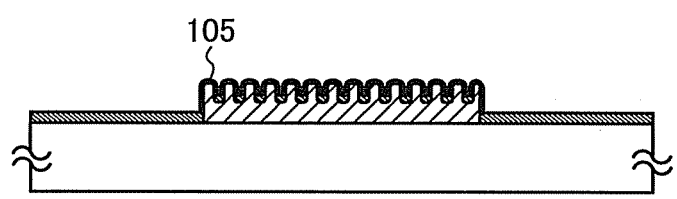

The organic compound-containing layer 105 containing a material to be deposited onto the deposition-target substrate is formed over the light-absorbing portion 104a (see FIG. 3B).

The organic compound-containing layer 105 is a layer that contains a material to be deposited onto the deposition-target substrate. By irradiating the deposition substrate with light, the material contained in the organic compound-containing layer 105 is heated to be at least partially deposited onto the deposition-target substrate. When the organic compound-containing layer 105 is heated, at least part of the material contained in the organic compound-containing layer 105 is melted and vaporized, whereby the film is deposited on the deposition-target substrate.

The organic compound-containing layer 105 is formed by a variety of methods. For example, the following wet processes can be used: spin coating, roll coating, die coating, blade coating, bar coating, gravure coating, spraying, casting, dipping, droplet discharging (ejecting) (an ink-jet method), a dispenser method, and various printings (a method by which a film can be formed in a desired pattern, such as screen (mimeograph) printing, offset (planographic) printing, letterpress printing, or gravure (intaglio) printing). Alternatively, a dry process such as vacuum evaporation, CVD, or sputtering can also be used.

The organic compound-containing layer 105 may contain a variety of organic compound materials or a variety of inorganic compound materials. In the case where an EL layer of a light-emitting element is formed, a material that can be deposited to form the EL layer is used. For example, it is possible to use an organic compound for forming an EL layer, such as a light-emitting material or a carrier-transporting material, as well as an inorganic compound for forming a carrier-transporting layer, carrier-injecting layer, an electrode of a light-emitting element, and the like which form an EL layer, such as metal oxide, metal nitride, metal halide, or an elementary substance of metal.

The organic compound-containing layer 105 may contain a plurality of materials. Furthermore, the organic compound-containing layer 105 may be a single layer or a stack of a plurality of layers.

In order to form the organic compound-containing layer 105 by a wet process, a desired material may be dissolved or dispersed in a solvent, and a liquid composition (a solution or a dispersion solution) may be adjusted. There is no particular limitation on the solvent as long as a material can be dissolved or dispersed therein and the material does not react therewith. Examples of the solvent are as follows: halogen-based solvents such as chloroform, tetrachloromethane, dichloromethane, 1,2-dichloroethane, and chlorobenzene; ketone-based solvents such as acetone, methyl ethyl ketone, diethyl ketone, n-propyl methyl ketone, and cyclohexanone; aromatic-based solvents such as benzene, toluene, and xylene; ester-based solvents such as ethyl acetate, n-propyl acetate, n-butyl acetate, ethyl propionate, γ-butyrolactone, and diethyl carbonate; ether-based solvents such as tetrahydrofuran and dioxane; amide-based solvents such as dimethylformamide and dimethylacetamide; dimethyl sulfoxide; hexane; water; and the like. A mixture of plural kinds of those solvents may also be used. By using a wet process, material use efficiency can be increased, resulting in reduction in production cost.

The organic compound-containing layer 105 having unevenness is formed by reflecting the shape of the projections 150a on the surface of the light-absorbing portion 104a. Therefore, the organic compound-containing layer 105 is not necessarily formed using a continuous thin film, and may be formed in fine island-like shapes which are discontinuous.

Next, a second substrate 107, which is a deposition-target substrate, is placed facing one surface of the first substrate 101a provided with the light-absorbing portion 104a and the organic compound-containing layer 105. The second substrate 107 is a deposition-target substrate onto which a desired layer is deposited by a deposition process.

It is preferable that the deposition substrate and the deposition-target substrate face each other such that the distance between the surface of the organic compound-containing layer 105 of the deposition substrate and a deposition-target surface of the deposition-target substrate is very short. When the distance is short, the movement distance of the material contained in the organic compound-containing layer 105 to the deposition-target surface is also short. Thus, a film can be deposited with high accuracy onto the deposition-target surface while preventing deformed patterns.

Depending on the size or arrangement of the substrates, an outermost film on the first substrate 101a and an outermost film on the second substrate 107 may be partially in contact with each other.

In the case where higher reliability is desired to be given to a film which is to be deposited in the deposition substrate in which the light-absorbing portion 104a and the organic compound-containing layer 105 are formed over the first substrate 101a, heat treatment is preferably performed on the deposition substrate in vacuum. Similarly, when heat treatment is also performed on the second substrate 107 which is the deposition-target substrate in vacuum before deposition, the reliability of a film to be deposited is increased. In particular, in the case of providing the deposition-target substrate with an insulating layer which serves as a partition wall, or the like, when contaminants such as water are removed by heat treatment in vacuum, a film with higher reliability can be deposited, and the reliability of a light-emitting element and a light-emitting device which are to be manufactured can also be increased.

Figure 3C:
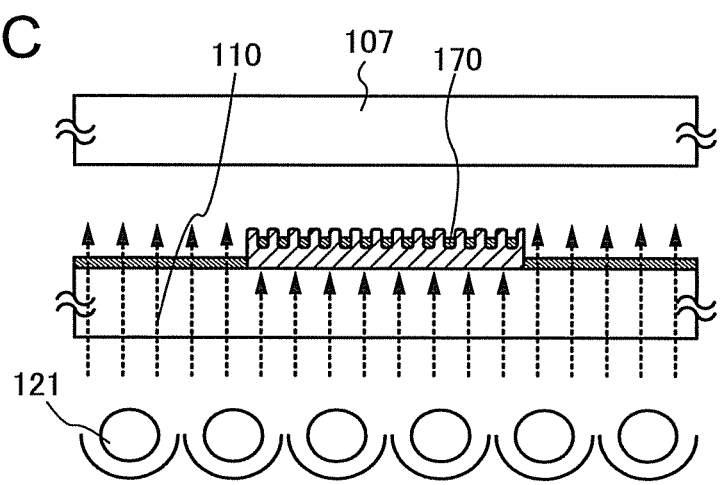

Next, irradiation with light 110 from a light source 121 is performed from a rear surface (a surface on which the light-absorbing portion 104a and the organic compound-containing layer 105 are not formed) side of the first substrate 101a (see FIG. 3C). At this time, the light emitted to the first substrate 101a is transmitted through the first substrate 101a to be absorbed by the light-absorbing portion 104a. Then, the light-absorbing portion 104a gives the heat obtained from the absorbed light to the material contained in the organic compound-containing layer 105.

At this time, as illustrated in FIG. 3C, the material contained in the organic compound-containing layer 105 is melted by heat supplied, and flows into the depressions in the surface of the light-absorbing portion 104a to become an organic compound material 170. The material contained in the organic compound-containing layer 105 flows into the plurality of minute depressions on the surface of the light-absorbing portion 104a; therefore, the material can be prevented from being flocculated on the surface of the light-absorbing portion 104a. Thus, the organic compound material 170 uniformly exists with respect to a thin film formation region of the deposition-target substrate. Accordingly, a thin film having a uniform thickness can be formed onto the deposition-target substrate.

Figure 3D:
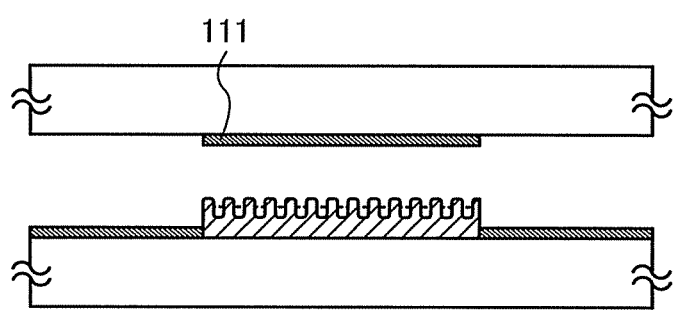
Figure 3E:
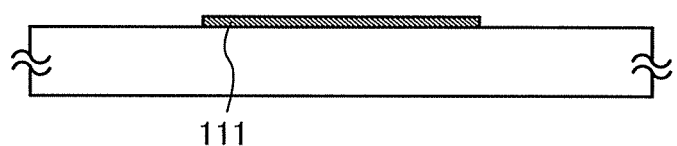

As illustrated in FIG. 3D, at least part of the material contained in the organic compound-containing layer 105 is deposited as a film 111 onto the second substrate 107. The film 111 is a film having a uniform thickness and good film quality. Further, when a film is deposited by light irradiation using a layer containing a mixture of a plurality of organic compounds which is formed over the light-absorbing portion having a surface with unevenness, a mixture film can be deposited onto the deposition-target substrate while a mixture state of the organic compound-containing layer kept. In this manner, the desirably patterned film 111 is formed onto the second substrate 107 (see FIG. 3E).

The step of irradiating the light-absorbing portion 104*a* with the light 110 is preferably performed under reduced pressure. When the irradiation with the light 110 is performed to deposit the material onto the deposition-target substrate under reduced pressure, an adverse effect of contaminants such as dust on a film to be deposited can be reduced. Alternatively, the step of irradiating the light-absorbing portion 104*a* with the light 110 may be performed while the organic compound-containing layer 105 is made to be in a heating state (a state in which the organic compound-containing layer 105 has heat). If the organic compound-containing layer 105 is subjected to heat treatment so that the material layer is in a heating state, the material contained in the material layer can be deposited onto the deposition-target substrate even by light irradiation using a light source of light with low power. Further, if the organic compound-containing layer 105 is in a heating state, a margin of a light irradiation condition can be enlarged. When the irradiation with the light 110 is performed immediately after the heat treatment which is performed at the time of fainting the organic compound-containing layer 105, the organic compound-containing layer 105 can be in a heating state. Alternatively, the irradiation with the light 110 may be performed while the organic compound-containing layer 105 is heated with use of a heating means such as a heater.

The light 110 used is light that is absorbed by the light-absorbing portion 104*a*, and the kind of light emitted from the light source 121 is not limited in particular.

As examples preferably used for the light source 121, flash lamps (such as xenon flash lamps and krypton flash lamps) are given. With the flash lamp, since a large area can be irradiated with light with extremely high intensity in a short period of time repeatedly, efficient and uniform heating can be performed regardless of the area of the substrate to be processed. In addition, the running cost can be suppressed because of a long life and low power consumption at the time of waiting for light emission of the flash lamp. A larger area can be processed at a time with lamp light as compared with laser light, resulting in reduction in manufacturing time and improvement in throughput.

As the light 110, intense light using a lamp as the light source 121, laser light obtained by using a laser as the light source 121, or the like can be used.

As the light 110 used, one or a combination of infrared light, visible light, and ultraviolet light can be used. For example, light (lamp light) emitted from an ultraviolet ray lamp, a black light, a halogen lamp, a metal halide lamp, a xenon arc lamp, a carbon arc lamp, a high-pressure sodium lamp, or a high-pressure mercury lamp may be used. In that case, the lamp light source may be continuously activated for irradiation for a required time or plural times.

Alternatively, laser light may be used as the light. As a laser, a laser capable of emitting ultraviolet light, visible light, or infrared light can be used. Laser light with various wavelengths can be used, and for example, laser light with a wavelength of 355 nm, 515 nm, 532 nm, 1030 nm, or 1064 nm can be used.

As the laser light, light emitted from one or more of the following can be used: gas lasers such as Ar lasers, Kr lasers, and excimer lasers; a laser whose medium is single crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ that is doped with one or more of Nd, Yb, Cr, Ti, Ho, Er, Tm, and Ta as a dopant; and solid-state lasers such as a glass laser, a ruby laser, an alexandrite laser, a Ti:sapphire laser, and a fiber laser. Alternatively, a second harmonic, a third harmonic, or other higher harmonics emitted from the aforementioned solid-state laser may also be used. The use of a solid-state laser whose laser medium is solid is advantageous in that the maintenance-free condition can be maintained for a long time and output power is relatively stable.

The laser spot preferably has a linear or rectangular shape. The linear or rectangular laser spot allows the substrate to be processed to be efficiently scanned with the laser light. Thus, time necessary for deposition (takt time) is reduced, resulting in improvement of productivity. The laser spot may alternatively have an elliptical shape.

In addition, deposition by light irradiation is preferably performed in a reduced-pressure atmosphere. Accordingly, it is preferable that the deposition chamber have a pressure of $5 \times 10^{-3}$ Pa or less, and more preferably from $10^{-6}$ Pa to $10^{-4}$ Pa.

When the light-absorbing portion 104*a* is selectively formed by reflecting a deposition pattern as in this embodiment, a thin film can be deposited in the pattern onto a deposition-target substrate.

A reflective layer may be selectively formed between the first substrate 101*a* and the light-absorbing portion 104*a* so that the light-absorbing portion 104*a* can be prevented from being irradiated with light. Light is reflected by the reflective layer; therefore, a thin film that reflects a pattern of the reflective layer can be deposited onto the deposition-target substrate.

Further, a heat-insulating layer which blocks heat conduction may be provided between the reflective layer and the organic compound-containing layer.

The materials contained in the organic compound-containing layer 105 formed over the first substrate can be deposited uniformly. Even in the case where the organic compound-containing layer 105 contains plural kinds of materials, a film containing the same materials in substantially the same weight ratio as the organic compound-containing layer 105 can be deposited onto the second substrate that is a deposition-target substrate. Accordingly, even in the case where plural kinds of materials with different deposition temperatures are used for deposition, in the deposition method according to this embodiment, the evaporation rate of each material does not need to be controlled unlike in co-evaporation. Therefore, without complicated control of the evaporation rate or the like, a desired layer containing different kinds of materials can be deposited easily and accurately.

In the case where a light-emitting layer of a light-emitting device is formed by using this embodiment, a film to be deposited may be made to correspond to one pixel, or a film to be deposited may be made to correspond to a plurality of pixels to manufacture light-emitting layers of the plurality of pixels at a time. For example, in the case where three color elements (e.g., RGB) are arranged in stripes to perform full-color display, a region including a plurality of pixels emitting the same color light is made to correspond to a heated region of the material layer of the deposition substrate, whereby light-emitting layers of the plurality of pixels can be deposited onto the deposition-target substrate.

When a full color display device is manufactured, light-emitting layers should be separately formed. In this case, light-emitting layers are formed by a deposition method of this embodiment, and thereby light-emitting layers having desired patterns can be separately formed with ease. In addition, the light-emitting layers can be separately formed with high accuracy.

By the deposition method of this embodiment, desired materials can be deposited onto a deposition-target substrate without being wasted. Thus, material use efficiency can be increased, resulting in reduction in production cost. Furthermore, materials can be prevented from being attached to an inner wall of a deposition chamber, and thus maintenance of a deposition apparatus can be facilitated.

By applying this embodiment, a flat and even film can be deposited. In addition, since a film can be deposited only at a desired region, a fine pattern can be formed and a high-definition light-emitting device can be manufactured.

Further, since the application of this embodiment enables selective deposition at a desired region at the time of deposition using light, material use efficiency can be increased, and further, it is possible to deposit a film of a desired shape easily with high accuracy; thus, productivity can be increased.

A thin film having a undo, in thickness and good film quality can be deposited onto a deposition-target substrate without providing a mask between an evaporation material and the deposition-target substrate.

By a thermal deposition method using light, a film having a uniform thickness and good film quality can be deposited.

The energy of light can be efficiently supplied to a material and thus light irradiation can be performed with lower energy.

A light-emitting element is formed using such a deposition substrate and such a deposition method as described above, whereby a highly reliable light-emitting device can be manufactured. Furthermore, a thin film can be deposited onto a large-area deposition-target substrate; thus, a large light-emitting device and a large electronic device can be manufactured.

Embodiment 2

In this embodiment, other examples of a deposition substrate are described with reference to FIGS. 7A to 7C. Materials and manufacturing methods similar to those of Embodiment 1 may be used if the functions thereof are similar to that of Embodiment 1.

Figure 7A:
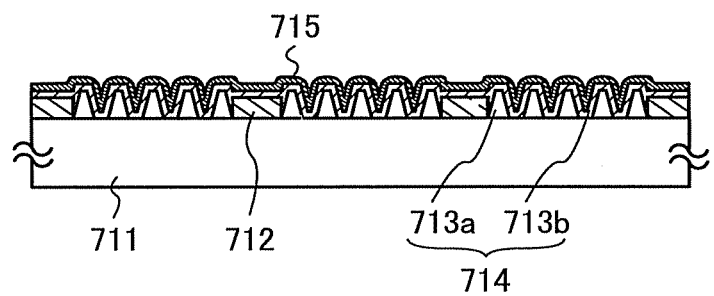
FIGS. 7A to 7C are cross-sectional views of examples of a deposition substrate.
Figure 7B:
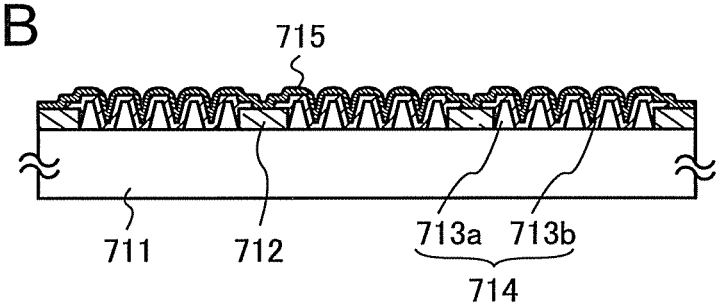
Figure 7C:
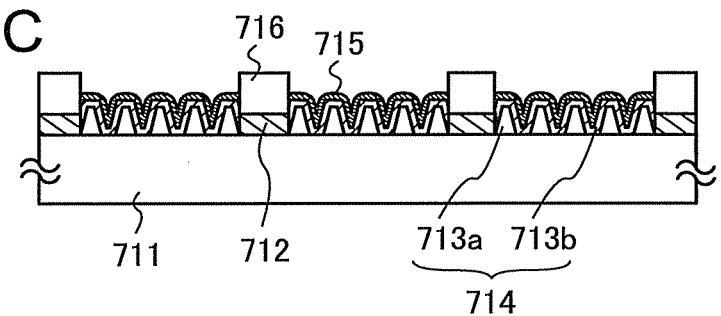

FIGS. 7A to 7C illustrate examples in each of which a deposition substrate is provided with reflective layers or/and heat-insulating layers in addition to a light-absorbing portion.

Reflective layers can be selectively formed between a light-transmitting substrate and a light-absorbing portion so that the light-absorbing portion can be prevented from being irradiated with light. Light is reflected by the reflective layers; therefore, a thin film that reflects a pattern of the reflective layers can be deposited onto a deposition-target substrate.

Further, heat-insulating layers which block heat conduction can be provided between reflective layers and an organic compound-containing layer. It is preferable that the heat-insulating layers have a light transmittance of 60% or more and be formed using a material having a lower thermal conductivity than materials used for the reflective layers and the light-absorbing portion. With a low thermal conductivity, heat generated from emitted light can be efficiently used for deposition. It is preferable that the heat-insulating layers completely block heat conduction; however, in this specification, layers which block heat conduction more than at least a light-absorbing portion are also referred to as heat-insulating layers.

In FIG. 7A, reflective layers 712 are selectively provided between a first substrate 711 and a light-absorbing portion 714, and an organic compound-containing layer 715 is formed over the light-absorbing portion 714. The light-absorbing portion 714 over the reflective layers 712 is not irradiated with light; therefore, a pattern of a region other than a region overlapping with a region where the reflective layers 712 are formed becomes a deposition pattern of a thin film in the deposition-target substrate. The light-absorbing portion 714 includes projections 713a and a light-absorbing film 713b. The light-absorbing film 713b has unevenness on their surfaces due to a plurality of projections 713a in contact with each other, so that unevenness is formed on the surface of the light-absorbing portion 714.

FIG. 7B illustrates an example of forming the light-absorbing portion 714 in a region except a region of the first substrate 711 where the reflective layers 712 are formed, by selectively forming the light-absorbing films 713b included in the light-absorbing portion 714, in FIG. 7A.

FIG. 7C illustrates an example in which heat-insulating layers 716 are provided over the reflective layers 712 in FIG. 7A.

By providing the heat-insulating layers 716, the light-absorbing portion 714 is not formed over the reflective layers 712. Thus, heat conduction can be prevented more. Further, heat can be prevented from being conducted to a deposition-target substrate. The heat-insulating layers have a function of controlling the distance between the deposition-target substrate and the deposition substrate.

By providing a plurality of heat-insulating layers as described above, heat can be prevented from being conducted from a region of the deposition-target substrate where a thin film is deposited to a region where a thin film is not deposited. Therefore, the shape of a thin film pattern on the deposition-target substrate can be accurately controlled, and thus, a high-definition thin film pattern can be obtained.

The reflective layers 712 are layers for reflecting light emitted to a region other than part of the light-absorbing portion 714 so that the part of the light absorption portion 714 is selectively irradiated with the light during deposition. Therefore, the reflective layers 712 are preferably formed using a material having a high reflectance with respect to the emitted light. Specifically, the reflective layers 712 preferably have a reflectance of 85% or more, and more preferably, a reflectance of 90% or more, with respect to the emitted light.

As a material for the reflective layers 712, for example, silver, gold, platinum, copper, an alloy containing aluminum, or an alloy containing silver can be used.

The reflective layers 712 preferably have thicknesses of 100 nm or more, which depend on a material. If the reflective layers 712 have thicknesses of 100 nm or more, the emitted light can be prevented from passing therethrough.

Furthermore, the reflective layer 712 can be processed into a desired shape by a variety of methods, but is preferably processed by dry etching. By use of dry etching, a sharp sidewall can be formed and thus a fine pattern can be obtained.

The heat-insulating layers 716 need to be formed using a material having a lower thermal conductivity than materials used for the reflective layers 712 and the light absorption portions 714. In the case of the structure where the light absorption portions are irradiated with light through the heat-insulating layers, the heat-insulating layers need to have a light-transmitting property. In that case, the heat-insulating layers need to be formed using a material that has a high light transmittance as well as a low thermal conductivity. Specifically, the heat-insulating layers are preferably formed using a material having a light transmittance of 60% or more. However, in the case where the light absorption portions do not need to transmit light, the heat-insulating layers do not need to have a light-transmitting property.

As a material used for the heat-insulating layers 716, for example, titanium oxide, silicon oxide, silicon nitride oxide, zirconium oxide, or silicon carbide can be used.

The thicknesses of the heat-insulating layers 716 are controlled so as to be larger than the difference in height between the depression and the projection of the unevenness in the light-absorbing portions. The thicknesses of the heat-insulating layers 716, which depend on a material, are preferably from 10 nm to 5 µm, and more preferably from 100 nm to 3 µm. With thicknesses from 10 nm to 5 µm, the heat-insulating layers 716 can transmit light while preventing heat from being conducted to the organic compound-containing layer 715.

The reflective layers 712, the heat-insulating layers 716, and the light-absorbing portion 714 (the projections 713a and the light-absorbing films 713b) can be formed by a variety of methods. For example, these layers can be formed by sputtering, electron beam evaporation, vacuum evaporation, chemical vapor deposition (CVD), or the like.

In addition, the greater the difference in reflectance between the reflective layers 712 and the light absorption portion 714 is, the more preferable it is. Specifically, the difference in reflectance to the wavelength of the emitted light is preferably 25% or more, and more preferably 30% or more.

The deposition substrate illustrated in FIGS. 7A to 7C is irradiated with light as in Embodiment 1 so that a desired-patterned film can be deposited on the deposition-target substrate. Accordingly, an effect similar to that of Embodiment 1 can be obtained by using the deposition substrate described in this embodiment.

In this embodiment, a minute pattern thin film can be formed over a deposition-target substrate, without providing a mask between an evaporation material and a deposition-target substrate.

Embodiment 3

In this embodiment, a method for manufacturing a light-emitting element and a light-emitting device is described.

Figure 10A:
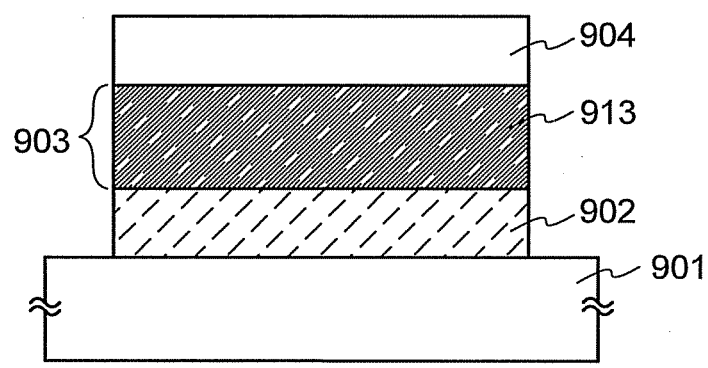
FIGS. 10A to 10B are cross-sectional views illustrating structures of a light-emitting element.
Figure 10B:
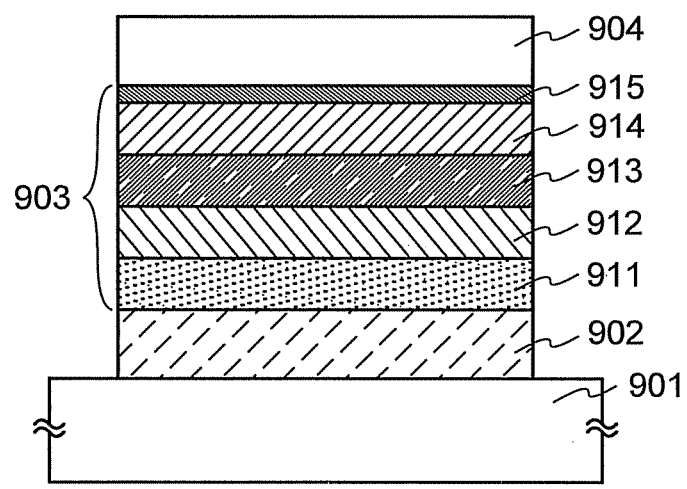

By application of the above embodiments, light-emitting elements illustrated in, for example, FIGS. 10A and 10B can be manufactured. In the light-emitting element illustrated in FIG. 10A, a first electrode 902, an EL layer 903 formed using only a light-emitting layer 913, and a second electrode 904 are stacked in this order over a substrate 901. One of the first electrode 902 and the second electrode 904 functions as an anode, and the other functions as a cathode. Holes injected from the anode and electrons injected from the cathode are recombined in the EL layer 903, whereby light emission can be obtained. In this embodiment, the first electrode 902 functions as the anode and the second electrode 904 functions as the cathode.

The light-emitting element illustrated in FIG. 10B shows the case where the EL layer 903 of FIG. 10A has a structure in which a plurality of layers are stacked. Specifically, a hole injecting layer 911, a hole transporting layer 912, a light-emitting layer 913, an electron transporting layer 914, and an electron injecting layer 915 are provided in this order from the first electrode 902 side. Note that the EL layer 903 functions as long as it has at least the light-emitting layer 913 as illustrated in FIG. 10A; thus, there is no need to provide all of these layers, and a layer to be provided may be appropriately selected as needed.

As the substrate 901 illustrated in FIGS. 10A and 10B, a substrate having an insulating surface or an insulating substrate is employed. Specifically, any of a variety of glass substrates made of glass used for the electronics industry, such as aluminosilicate glass, aluminoborosilicate glass, or barium borosilicate glass; a quartz substrate; a ceramic substrate; a sapphire substrate; or the like can be used.

For the first electrode 902 and the second electrode 904, any of various types of metals, alloys, electrically conductive compounds, mixtures thereof, and the like can be used. Specific examples are as follows: indium tin oxide (ITO); indium tin oxide containing silicon or silicon oxide; indium zinc oxide (IZO); indium oxide containing tungsten oxide and zinc oxide; and the like. Other examples are as follows: gold (Au); platinum (Pt); nickel (Ni); tungsten (W); chromium (Cr); molybdenum (Mo); iron (Fe); cobalt (Co); copper (Cu); palladium (Pd); nitride of a metal material (such as titanium nitride); and the like.

Films of these materials are generally formed by sputtering. For example, a film of indium zinc oxide can be formed by sputtering using a target in which zinc oxide of 1 wt % to 20 wt % is added to indium oxide. A film of indium oxide containing tungsten oxide and zinc oxide can be formed by sputtering using a target which contains tungsten oxide of 0.5 wt % to 5 wt % and zinc oxide of 0.1 wt % to 1 wt % with respect to indium oxide. Alternatively, films of these materials may be formed by an ink-jet method, a spin coating method, or the like by application of a sol-gel method or the like.

Furthermore, aluminum (Al), silver (Ag), an alloy containing aluminum, or the like can be used. Moreover, any of the following materials having a low work function can be used: elements which belong to Group 1 and Group 2 of the periodic table, that is, alkali metals such as lithium (Li) and cesium (Cs) and alkaline earth metals such as magnesium (Mg), calcium (Ca), and strontium (Sr), and alloys thereof (an alloy of aluminum, magnesium, and silver and an alloy of aluminum and lithium); rare earth metals such as europium (Eu) and ytterbium (Yb), and alloys thereof; and the like.

Films of alkali metals, alkaline earth metals, and alloys thereof can be formed by a vacuum evaporation method. Furthermore, films of alloys each containing an alkali metal or an alkaline earth metal can be formed by sputtering. Alternatively, a film of silver paste or the like can be formed by an ink-jet method or the like. Each of the first and the second electrodes 902 and 904 can be formed as a stacked-layer film as well as a single-layer film.

Note that, in order to extract light emitted from the EL layer 903 to the outside, one or both of the first and the second electrodes 902 and 904 is/are formed to transmit light. For example, one or both of the first and the second electrodes 902 and 904 is/are formed using a conductive material having a light-transmitting property, such as indium tin oxide, or formed using silver, aluminum, or the like to a thickness of several nanometers to several tens of nanometers. Alternatively, one or both of the first and the second electrodes 902 and 904 can have a stacked-layer structure including a thin film of metal such as silver or aluminum with a small thickness and a thin film of a conductive material having a light-transmitting property, such as an ITO film.

Note that the EL layer 903 of the light-emitting element described in this embodiment (the hole injecting layer 911, the hole transporting layer 912, the light-emitting layer 913, the electron transporting layer 914, or the electron injecting layer 915) can be formed by the deposition method described in Embodiment 1. In addition, the electrodes can also be formed by the deposition method described in Embodiment 1.

Various kinds of materials can be used for the light-emitting layer 913. For example, a fluorescent compound which exhibits fluorescence or a phosphorescent compound which exhibits phosphorescence can be used.

Examples of a phosphorescent compound that can be used for the light-emitting layer 913 are given below. Examples of light-emitting materials for blue emission include the following: bis[2-(4',6'-difluorophenyl)pyridinato-N,$C^{2'}$]iridium (III)tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis[2-(3',5'bistrifluoromethylphenyl)pyridinato-N,$C^{2'}$]iridium(III)picolinate (abbreviation: Ir($CF_3$ppy)$_2$(pic)), bis[2-(4',6'-difluorophenyl)pyridinato-N,$C^{2'}$]iridium(III)acetylacetonate (abbreviation: FIr(acac)) and the like. Examples of light-emitting materials for green emission include the following: tris(2-phenylpyridinato-N,$C^{2'}$)iridium(III) (abbreviation: Ir(ppy)$_3$); bis(2-phenylpyridinato-N,$C^{2'}$)iridium(III)acetylacetonate (abbreviation: Ir(ppy)$_2$(acac)); bis(1,2-diphenyl-1H-benzimidazolato)iridium(III)acetylacetonate (abbreviation: Ir(pbi)$_2$(acac)); bis(benzo[h]quinolinato)iridium(III) acetylacetonate (abbreviation: Ir(bzq)$_2$(acac)); and the like. Examples of light-emitting materials for yellow emission include the following: bis(2,4-diphenyl-1,3-oxazolato-N,$C^{2'}$) iridium(III)acetylacetonate (abbreviation: Ir(dpo)$_2$(acac)); bis[2-(4'-perfluorophenylphenyl)pyridinato]iridium(III) acetylacetonate (abbreviation: Ir(p-PF-ph)$_2$(acac)); bis(2-phenylbenzothiazolato-N,$C^{2'}$)iridium(III)acetylacetonate (abbreviation: Ir(bt)$_2$(acac)); and the like. Examples of light-emitting materials for orange emission include the following: tris(2-phenylquinolinato-N,$C^{2'}$)iridium(III) (abbreviation: Ir(pq)$_3$); bis(2-phenylquinolinato-N,$C^{2'}$)iridium(III)acetylacetonate (abbreviation: Ir(pq)$_2$(acac)); and the like. Examples of light-emitting materials for red emission include organic metal complexes, such as bis[2-(2'-benzo[4,5-α]thienyl)pyridinato-N,$C^{3'}$)iridium(III)acetylacetonate (abbreviation: Ir(btp)$_2$(acac)); bis(1-phenylisoquinolinato-N,$C^{2'}$)iridium(III)acetylacetonate (abbreviation: Ir(piq)$_2$(acac)); (acetylacetonato)bis[2,3-bis(4-fluorophenyl)quinoxalinato] iridium(III) (abbreviation: Ir(Fdpq)$_2$(acac)); 2,3,7,8,12,13, 17,18-octaethyl-21H,23H-porphyrinplatinum(II) (abbreviation: PtOEP). In addition, rare-earth metal complexes, such as tris(acetylacetonato)(monophenanthroline)terbium(III) (abbreviation: Tb(acac)$_3$(Phen)); tris(1,3-diphenyl-1,3-propanedionato)(monophenanthroline)europium(III) (abbreviation: Eu(DBM)$_3$(Phen)); or tris[1-(2-thenoyl)-3,3,3-trifluoroacetonato](monophenanthroline)europium(III) (abbreviation: Eu(TTA)$_3$(Phen)), exhibit light emission from rare-earth metal ions (electron transition between different multiplicities); thus, rare-earth metal complexes can be used as phosphorescent compounds.

Examples of fluorescent compounds that can be used for the light-emitting layer 913 are given below. Examples of light-emitting materials for blue emission include the following: N,N'-bis[4-(9H-carbazol-9-yl)phenyl]-N,N-diphenyl-stilbene-4,4'-diamine (abbreviation: YGA2S); 4-(9H-carbazol-9-yl)-4'-(10-phenyl-9-anthryl)triphenylamine (abbreviation: YGAPA); and the like. Examples of light-emitting materials for green emission include the following: N-(9, 10-diphenyl-2-anthryl)-N,9-diphenyl-9H-carbazole-3-amine (abbreviation: 2PCAPA), N-[9,10-bis(1,1'-biphenyl-2-yl)-2-anthryl]-N,9-diphenyl-9H-carbazole-3-amine (abbreviation: 2PCABPhA), N-(9,10-diphenyl-2-anthryl)-N, N',N'-triphenyl-1,4-phenylenediamine (abbreviation: 2DPAPA), N-[9,10-bis(1,1'-biphenyl-2-yl)-2-anthryl]-N,N', N'-triphenyl-1,4-phenylenediamine (abbreviation: 2DPABPhA), 9,10-bis(1,1'-biphenyl-2-yl)-N-[4-(9H-carbazol-9-yl) phenyl]-N-phenylanthracene-2-amine (abbreviation: 2YGABPhA), N,N,9-triphenylanthracene-9-amine (abbreviation: DPhAPhA), and the like. Examples of light-emitting materials for yellow emission include the following: rubrene; 5,12-bis(1,1'-biphenyl-4-yl)-6,11-diphenyltetracene (abbreviation: BPT); and the like. Examples of light-emitting materials for red emission include the following: N,N,N',N'-tetrakis(4-methylphenyl)tetracene-5,11-diamine (abbreviation: p-mPhTD); 7,13-diphenyl-N,N,N',N'-tetrakis(4-methylphenyl)acenaphtho[1,2-a]fluoranthene-3,10-diamine (abbreviation: p-mPhAFD); and the like.

The light-emitting layer 913 may have a structure in which a substance having a high light-emitting property (a dopant material) is dispersed in another substance (a host material), whereby crystallization of the light-emitting layer can be suppressed. In addition, concentration quenching which results from high concentration of the substance having a high light-emitting property can be suppressed.

As the substance in which the substance having a high light-emitting property is dispersed, when the substance having a high light-emitting property is a fluorescent compound, a substance having singlet excitation energy (the difference in energy between a ground state and a singlet excited state) which is higher than that of the fluorescent compound is preferably used. When the substance having a high light-emitting property is a phosphorescent compound, a substance having triplet excitation energy (the difference in energy between a ground state and a triplet excited state) which is higher than that of the phosphorescent compound is preferably used.

Examples of host materials used for the light-emitting layer 913 include the following: 4,4'-bis[N-(1-naphthyl)-N-phenylamino]biphenyl (abbreviation: NPB), tris(8-quinolinolato)aluminum(III) (abbreviation: Alq), 4,4'-bis[N-(9,9-dimethylfluoren-2-yl)-N-phenylamino]biphenyl (abbreviation: DFLDPBi), bis(2-methyl-8-quinolinolato)(4-phenylphenolato)aluminum(III) (abbreviation: BAlq), 4,4'-di (9-carbazolyl)biphenyl (abbreviation: CBP), 2-tert-butyl-9, 10-di(2-naphthyl)anthracene (abbreviation: t-BuDNA), 9-[4-(9-carbazolyl)phenyl]-10-phenylanthracene (abbreviation: CzPA); and the like.

As the dopant material, any of the above-mentioned phosphorescent compounds and fluorescent compounds can be used.

When the light-emitting layer 913 has a structure in which a substance having a high light-emitting property (a dopant material) is dispersed in another substance (a host material), a mixed layer of a host material and a guest material may be formed as an organic compound-containing layer over a deposition substrate. Alternatively, the organic compound-containing layer over the deposition substrate may have a stacked-layer structure in which a layer containing a host material and a layer containing a dopant material are stacked. The light-emitting layer 913, when formed using a deposition substrate having an organic compound-containing layer with such a structure, contains a substance in which a light-emitting material is dispersed (host material) and a substance having a high light-emitting property (dopant material), and has a structure in which the substance having a high light-emitting property (dopant material) is dispersed in the substance in which a light-emitting material is dispersed (host material). Note that, for the light-emitting layer 913, two or more kinds of host materials and a dopant material may be used, or two or more kinds of dopant materials and a host material may be used. Alternatively, two or more kinds of host materials and two or more kinds of dopant materials may be used.

In the case of forming the light-emitting element illustrated in FIG. 10B, the EL layer 903 can be formed over the first electrode 902 over the substrate 901 by the method described in Embodiment 1 in such a manner that deposition substrates described in Embodiment 1, which each have an organic compound-containing layer formed with a material of one of the layers in the EL layer 903 (the hole injecting layer 911, the hole transporting layer 912, the light-emitting layer 913, the electron transporting layer 914, and the electron injecting layer 915) are prepared for respective layers and a different deposition substrate is used for deposition of each layer. Then, the second electrode 904 is formed over the EL layer 903; thus, the light-emitting element illustrated in FIG. 10B can be obtained. Note that the method described in Embodiment 1 can be used in this case for each layer of the EL layer 903, whereas the method described in Embodiment 1 may be used for only some of the layers.

In the case where films are stacked over a deposition-target substrate by a wet process, a liquid composition containing a material is directly attached to a lower film, and thus the lower film is dissolved depending on a solvent contained in the composition; therefore, materials that can be stacked are limited. However, in the case where films are stacked by the deposition method disclosed in this specification, there is no need to consider the effect of the solvent on the lower film because the solvent is not directly attached to the lower film. Accordingly, the flexibility of materials that can be stacked is increased. If a film is directly formed on a deposition-target substrate by a wet process, heat treatment needs to be performed under conditions that do not affect the lower film that has been deposited on the deposition-target substrate; therefore, film quality cannot be sufficiently improved in some cases.

For example, the hole injecting layer 911 can be formed using molybdenum oxide, vanadium oxide, ruthenium oxide, tungsten oxide, manganese oxide, or the like. Alternatively, the hole injecting layer can be formed using a phthalocyanine-based compound such as phthalocyanine (abbreviation: $H_2Pc$) or copper phthalocyanine (abbreviation: CuPc), a high molecular compound such as poly(3,4-ethylenedioxythiophene)/poly(styrenesulfonate) (PEDOT/PSS), or the like.

As the hole injecting layer 911, a layer which contains a substance having a high hole transporting property and a substance having an electron-accepting property can be used. The layer which contains a substance having a high hole transporting property and a substance having an electron-accepting property has high carrier density and an excellent hole injecting property. When the layer which contains a substance having a high hole transporting property and a substance having an electron-accepting property is used as a hole injecting layer which is in contact with an electrode that functions as an anode, any of various kinds of metals, alloys, electrically conductive compounds, mixtures thereof, and the like can be used as a material of the electrode which functions as an anode regardless of its magnitude of work function.

Examples of the substance having an electron-accepting property which is used for the hole injecting layer 911 include the following: 7,7,8,8-tetracyano-2,3,5,6-tetrafluoroquinodimethane (abbreviation: F4-TCNQ); chloranil; and the like. Other examples are transition metal oxides. Still other examples are oxides of metals belonging to Groups 4 to 8 of the periodic table. Specifically, vanadium oxide, niobium oxide, tantalum oxide, chromium oxide, molybdenum oxide, tungsten oxide, manganese oxide, and rhenium oxide are preferable because of their high electron-accepting properties. Among them, molybdenum oxide is especially preferable because it is stable also in the atmosphere, has a low hygroscopic property, and can be easily handled.

As the substance having a high hole transporting property used for the hole injecting layer 911, any of various compounds such as aromatic amine compounds, carbazole derivatives, aromatic hydrocarbons, and high molecular compounds (such as oligomers, dendrimers, and polymers) can be used. Note that it is preferable that the substance having a high hole transporting property used for the hole injecting layer be a substance having a hole mobility of $10^{-6}$ $cm^2/Vs$ or more. Note that any other substances that have a hole transporting property which is higher than an electron transporting property may be used. Specific examples of the substance having a high hole transporting property, which can be used for the hole injecting layer 911, are given below.

Examples of aromatic amine compounds that can be used for the hole injecting layer 911 include the following: 4,4'-bis[N-(1-naphthyl)-N-phenylamino]biphenyl (abbreviation: NPB); N,N'-bis(3-methylphenyl)-N,N-diphenyl-[1,1'-biphenyl]-4,4'-diamine (abbreviation: TPD); 4,4',4''-tris(N,N-diphenylamino)triphenylamine (abbreviation: TDATA); 4,4',4''-tris[N-(3-methylphenyl)-N-phenylamino]triphenylamine (abbreviation: MTDATA); 4,4'-bis[N-(spiro-9,9'-bifluoren-2-yl)-N-phenylamino]biphenyl (abbreviation: BSPB); and the like. Other examples are as follows: N,N'-bis(4-methylphenyl)(p-tolyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N'-(3-methylphenyl)-N'-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); and the like.

Specific examples of carbazole derivatives that can be used for the hole injecting layer 911 include the following: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

Other examples of carbazole derivatives that can be used for the hole injecting layer 911 include the following: 4,4'-di(N-carbazolyl)biphenyl (abbreviation: CBP); 1,3,5-tris[4-(N-carbazolyl)phenyl]benzene (abbreviation: TCPB); 9-[4-(10-phenyl-9-anthryl)phenyl]-9H-carbazole (abbreviation: CzPA); 1,4-bis-[4-(N-carbazolyl)phenyl]-2,3,5,6-tetraphenylbenzene; and the like.

Examples of aromatic hydrocarbons that can be used for the hole injecting layer 911 include the following: 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA), 9,10-di(2-naphthyl)anthracene (abbreviation: DNA); 9,10-diphenylanthracene (abbreviation: DPAnth), 2-tert-butylanthracene (abbreviation: t-BuAnth); 9,10-bis(4-methyl-1-naphthyl)anthracene (abbreviation: DMNA); 9,10-bis[2-(1-naphthyl)phenyl]-2-tert-butyl-anthracene, 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl, 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides, pentacene, coronene, and the like can also be given. As these aromatic hydrocarbons listed here, it is preferable that an aromatic hydrocarbon having a hole mobility of $1\times10^{-6}$ cm$^2$/Vs or more and having 14 to 42 carbon atoms be used.

Note that an aromatic hydrocarbon that can be used for the hole injecting layer 911 may have a vinyl skeleton. Examples of aromatic hydrocarbons having a vinyl group include the following: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like are given.

In addition, the layer which contains a substance having a high hole transporting property and a substance having an electron-accepting property is excellent in not only a hole injecting property but also in a hole transporting property, and thus the above-described hole injecting layer 911 may be used as the hole transporting layer.

The hole transporting layer 912 is a layer which contains a substance having a high hole transporting property. Examples of the substance having a high hole transporting property include aromatic amine compounds such as 4,4'-bis[N-(1-naphthyl)-N-phenylamino]biphenyl (abbreviation: NPB), N,N'-bis(3-methylphenyl)-N,N-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methyl-phenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), and the like. The substances listed here mainly have a hole mobility of $10^{-6}$ cm$^2$/Vs or more. Note that any other materials that have a hole transporting property which is higher than an electron transporting property may be used. The layer which contains a substance having a high hole transporting property is not limited to a single layer and may be a stacked layer including two or more layers formed using the above-mentioned substances.

The electron transporting layer 914 is a layer which contains a substance having a high electron transporting property. Examples of the substance having a high electron transporting property include metal complexes having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), bis(2-methyl-8-quinolinolato)(4-phenylphenolato)aluminum (abbreviation: BAlq), and the like. Other examples are metal complexes having an oxazole-based or a thiazole-based ligand, such as bis[2-(2-hydroxyphenyl)benzoxazolato]zinc (abbreviation: Zn(BOX)$_2$) and bis[2-(2-hydroxyphenyl)-benzothiazolato]zinc (abbreviation: Zn(BTZ)$_2$), and the like. Besides the metal complexes, other examples are as follows: 2-(4-biphenyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 3-(4-biphenyl)-4-phenyl-5-(4-tert-butylphenyl)-1,2,4-triazole (abbreviation: TAZ01); bathophenanthroline (abbreviation: BPhen), bathocuproine (abbreviation: BCP); and the like. The substances listed here mainly have an electron mobility of $10^{-6}$ cm$^2$/Vs or more. Note that any other materials that have an electron transporting property which is higher than a hole transporting property may be used for the electron transporting layer. The electron transporting layer is not limited to a single layer and may be a stacked layer including two or more layers formed using the above-mentioned substances.

The electron injecting layer 915 can be formed using an alkali metal compound or an alkaline earth metal compound, such as lithium fluoride (LiF), cesium fluoride (CsF), or calcium fluoride (CaF$_2$). Furthermore, a layer in which a substance having an electron transporting property is combined with an alkali metal or an alkaline earth metal can be employed. For example, a layer of Alq containing magnesium (Mg) can be used. Note that it is preferable that the layer in which a substance having an electron transporting property is combined with an alkali metal or an alkaline earth metal be used as the electron injecting layer because electrons are efficiently injected from the second electrode 904.

Note that there is no particular limitation on the stacked-layer structure of layers of the EL layer 903. The EL layer 903 may be formed with an appropriate combination of a light-emitting layer with any of layers which contain a substance having a high electron transporting property, a substance having a high hole transporting property, a substance having a high electron injecting property, a substance having a high hole injecting property, a bipolar substance (a substance having high electron and hole transporting properties), and the like.

Light emission obtained in the EL layer 903 is extracted to the outside through one or both of the first and the second electrodes 902 and 904. Therefore, one or both of the first and the second electrodes 902 and 904 is/are an electrode having a light-transmitting property. In the case where only the first electrode 902 is an electrode having a light-transmitting property, light is extracted from the substrate 901 side through the first electrode 902. In the case where only the second electrode 904 is an electrode having a light-transmitting property, light is extracted from the side opposite to the substrate 901 side through the second electrode 904. In the case where both the first electrode 902 and the second electrode 904 are electrodes having light-transmitting properties, light is extracted from both the substrate 901 side and the side opposite to the substrate 901 side through the first electrode 902 and the second electrode 904.

Note that although FIGS. 10A and 10B each illustrate a structure in which the first electrode 902 functioning as an anode is provided on the substrate 901 side, the second electrode 904 functioning as a cathode may be provided on the substrate 901 side.

The EL layer 903 may be formed by the deposition method described in Embodiment 1 in combination with another deposition method. Each electrode or each layer may be formed by a different method. Examples of dry methods include a vacuum evaporation method, an electron beam evaporation method, sputtering, and the like. Examples of wet methods include an ink-jet method, a spin coating method, and the like.

In the light-emitting element of this embodiment, an EL layer can be formed, and thus, a highly accurate film can be formed efficiently. Therefore, not only improvement in characteristics of the light-emitting element, but also improvement in yield and reduction in cost can be achieved.

This embodiment can be combined with any of Embodiments 1 and 2 as appropriate.

Embodiment 4

In this embodiment, a passive matrix light-emitting device manufactured using the deposition substrate and the deposition method which are disclosed in this specification is described with reference to FIGS. 8A to 8C and FIGS. 9A to 9D.

In this embodiment, an example of providing a partition (an insulating layer) for separating the light-emitting elements in a passive matrix light-emitting device is described.

FIGS. 8A to 8C and FIGS. 9A to 9D illustrate an example of a light-emitting device having a two-layer partition wall.

Figure 8A:
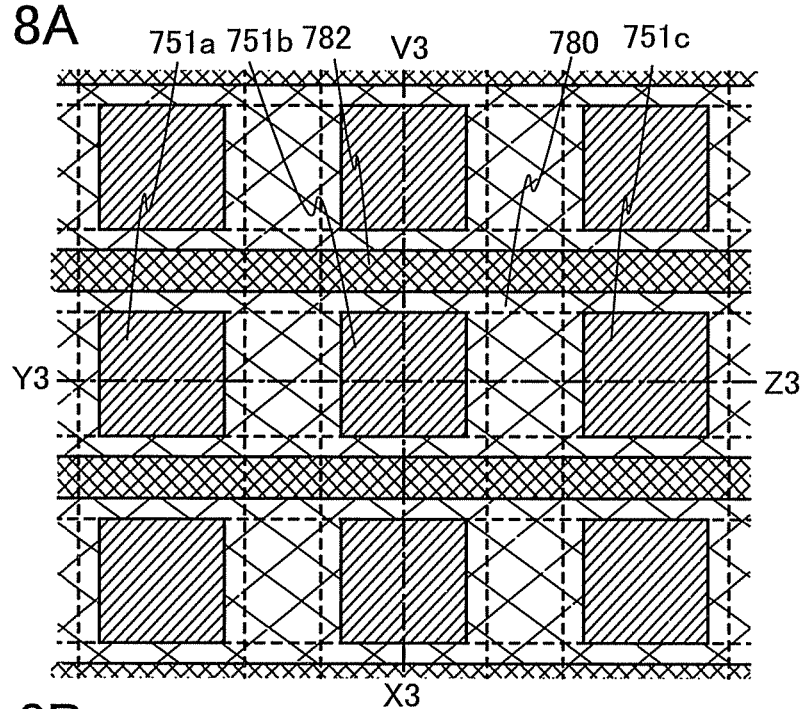
FIGS. 8A to 8C are a plan view and cross-sectional views of a light-emitting device.
Figure 8B:
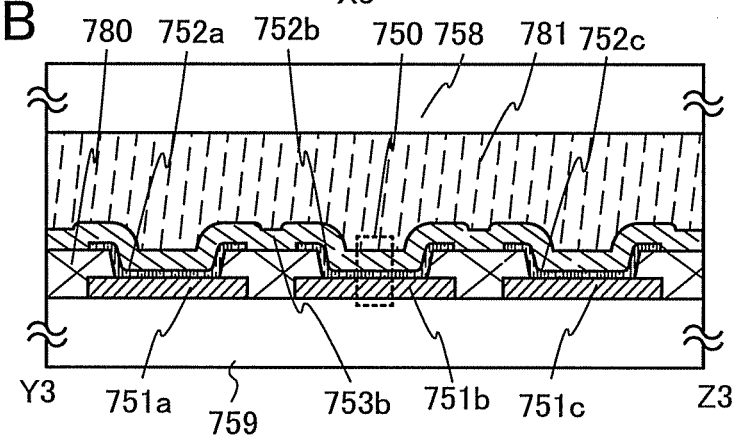
Figure 8C:
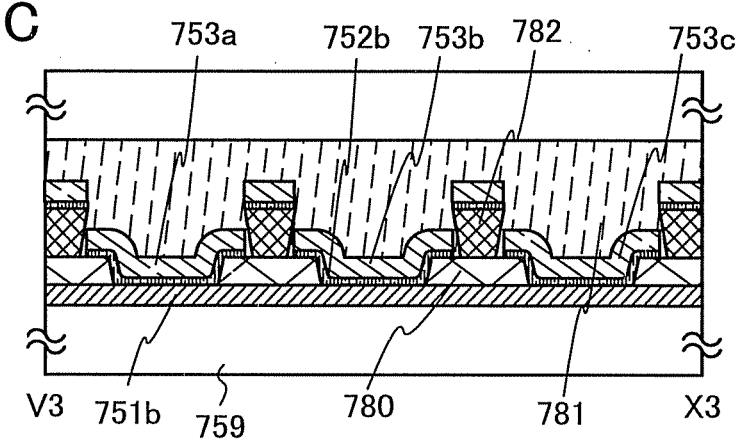

FIG. 8A is a plan view of a light-emitting device, and FIG. 8B is a cross-sectional view taken along line Y3-Z3 of FIG. 8A. FIG. 8C is a cross-sectional view taken along line V3-X3 of FIG. 8A. Note that FIG. 8A is a plan view illustrating the state in which a partition wall 782 has just been formed, and the EL layer and the second electrode layer are omitted in FIG. 8A.

In the light-emitting device of FIG. 8A, first electrode layers 751a, 751b, and 751c extending in a first direction, which are used for the light-emitting elements; EL layers 752a, 752b, and 752c that are selectively formed over the first electrode layers 751a, 751b, and 751c, respectively; and second electrode layers 753a, 753b, and 753c extending in a second direction perpendicular to the first direction, which are used for the light-emitting elements, are formed over an element substrate 759 (see FIGS. 8A to 8C).

In FIGS. 8A and 8B, the first electrode layer 751b functioning as a data line (a signal line) and the second electrode layer 753b functioning as a scan line (a source line) cross each other with the EL layer 752b interposed therebetween, so that a light-emitting element 750 is formed.

As illustrated in FIGS. 8A to 8C, a pixel region includes an opening over each of the first electrode layers 751a, 751b, and 751c, and a partition wall 780 is selectively formed. As illustrated in FIG. 8B, the partition wall 780 has a tapered shape to cover the end portions of the first electrode layers 751a, 751b, and 751c.

The partition wall 782 is selectively formed over the partition wall 780. The partition wall 782 has a function to discontinuously separate the EL layer and the second electrode layer formed over the partition wall 780. The sidewalls of the partition wall 782 have such a slope that the distance between opposite sidewalls is gradually narrowed toward the surface of the substrate. That is, a cross section in the direction of a short side of the partition wall 782 is a trapezoid, in which a lower base (a base that faces a surface of the partition wall 780 and touches the partition wall 780) is shorter than an upper base (a base that faces the surface of the partition wall 780 and does not touch the partition wall 780). Since the partition wall 782 has a so-called inversely tapered shape, the EL layer 752b is divided by the partition wall 782 in a self-aligned manner and can be selectively formed over the first electrode layer 751b. Thus, adjacent light-emitting elements are divided without being processed by etching, resulting in prevention of electrical failure such as a short circuit between the light-emitting elements.

A method for manufacturing the light-emitting device of this embodiment illustrated in FIG. 8B, using the deposition method disclosed in this specification, will be described with reference to FIGS. 9A to 9D.

Figure 9A:
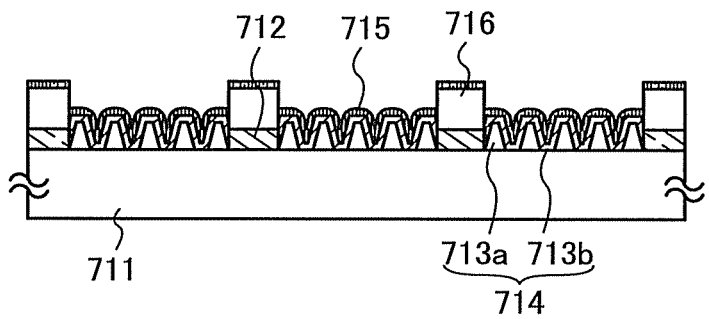
FIGS. 9A to 9D are cross-sectional views illustrating manufacturing steps of a light-emitting device.

A deposition substrate illustrated in FIG. 9A has a structure similar to that of FIG. 7C illustrated in Embodiment 2.

In the deposition substrate, reflective layers 712 are selectively formed over a first substrate 711, and heat-insulating layers 716 are formed over the reflective layers 712. A light-absorbing portion 714 is formed in a region not overlapping with the reflective layers 712. An organic compound-containing layer 715 is foamed in the uppermost layer of the deposition substrate. The light-absorbing portion 714 includes projections 713a and light-absorbing films 713b. The light-absorbing films 713b have unevenness on their surfaces due to the plurality of projections 713a which are in contact with each other, so that the unevenness is formed on the surface of the light-absorbing portion 714.

Figure 9B:
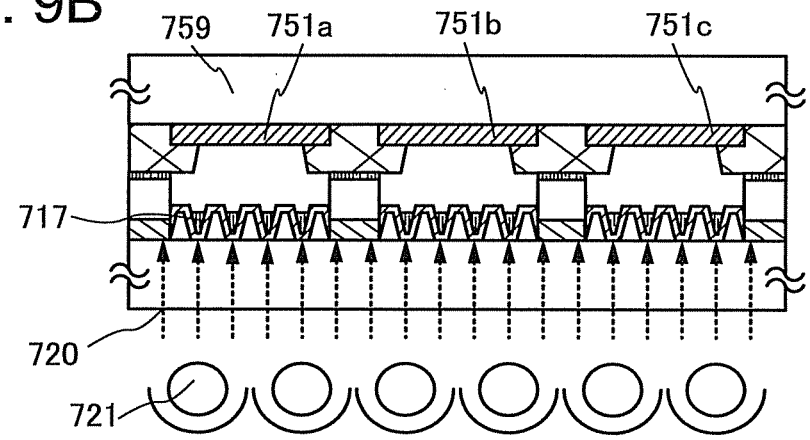

First electrode layers 751a, 751b, and 751c and a partition wall 780 are formed on an element substrate 759 that is a deposition-target substrate. The element substrate 759 and the first substrate 711 are placed so that the organic compound-containing layer 715 faces the first electrode layers 751a, 751b, and 751c and the partition wall 780 (see FIG. 9B). When the partition wall 780 and the heat-insulating layers 716 are formed and the deposition substrate and the deposition-target substrate are provided in contact with each other as illustrated in FIG. 9B, the pixel region in each deposition-target region can be separated from other pixel regions. Accordingly, a material evaporated from the organic compound-containing layer by light irradiation can be prevented from being attached to the other pixel regions.

Light 720 is emitted using a light source 721 from the back surface of the first substrate 711 (the surface that does not include the organic compound-containing layer 715). At this time, the light with which the first substrate 711 is irradiated passes through the first substrate 711 and is absorbed by the light-absorbing films 713b of the light-absorbing portion 714. Then, heat obtained from the absorbed light is supplied from the light-absorbing portion 714 to the material included in the organic compound-containing layer 715.

At this time, as illustrated in FIG. 9B, the material contained in the organic compound-containing layer 715 is melted by heat supplied, and flows into the depressions in the surface of the light-absorbing portion 714 to become an organic compound material 717. The material flows into the plurality of minute depressions in the surface of the light-absorbing portion 714; therefore, the organic compound material 717 can be prevented from being flocculated on the surface of the light-absorbing portion 714. Thus, the organic compound material 717 exists uniformly with respect to a thin film formation region of the deposition-target substrate. Accordingly, a thin film having a uniform thickness can be formed on a deposition-target substrate.

Figure 9C:
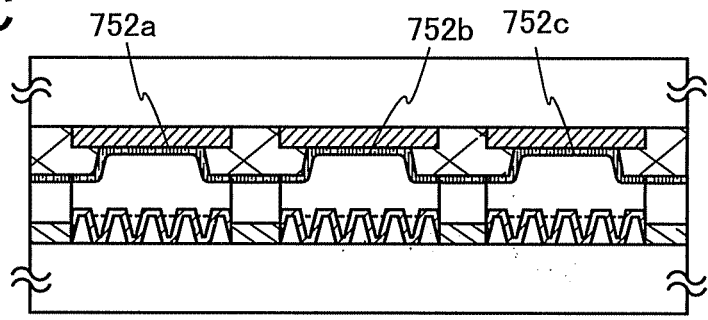

As illustrated in FIG. 9C, at least part of the material included in the organic compound-containing layer 715 is deposited as EL layers 752a, 752b, and 752c on the element substrate 759. The EL layers 752a, 752b, and 752c are films each of which has a uniform thickness and good film quality. Further, when a film is deposited by light irradiation using a layer including a mixture of a plurality of organic compounds which is formed over a light-absorbing portion having a surface with unevenness, a mixture film can be deposited onto a deposition-target substrate while a mixture state of the organic compound-containing layer kept.

Figure 9D:
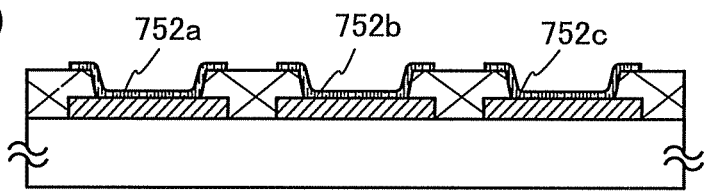

Through the above steps, the EL layers 752a, 752b, and 752c can be selectively formed on the first electrode layers 751a, 751b, and 751c, respectively, which are formed on the element substrate 759 (see FIG. 9D).

The second electrode layer 753b and a fill layer 781 are formed over the EL layers 752a, 752b, and 752c illustrated in FIG. 9D, and sealed with a sealing substrate 758, whereby the light-emitting device illustrated in FIG. 8B can be completed.

As the sealing substrate 758, a glass substrate, a quartz substrate, or the like can be used. Alternatively, a flexible substrate may be used. The flexible substrate is a substrate that can be bent. For example, besides a plastic substrate made of polycarbonate, polyarylate, polyether sulfone, or the like, a high-molecular material elastomer that exhibits characteristics of an elastic body like rubber at room temperature and can be plasticized to be processed like a plastic at high temperature can be used. Further alternatively, a film (a film made of polypropylene, polyester, vinyl, polyvinyl fluoride, vinyl chloride, or the like) or an inorganic evaporated film can be used.

For the partition walls 780 and 782, silicon oxide, silicon nitride, silicon oxynitride, aluminum oxide, aluminum nitride, aluminum oxynitride, or other inorganic insulating materials; acrylic acid, methacrylic acid, or a derivative thereof; a heat-resistant polymer such as polyimide, aromatic polyamide, or polybenzimidazole; or a siloxane resin may be used. Alternatively, a resin material such as a vinyl resin such as polyvinyl alcohol or polyvinylbutyral, an epoxy resin, a phenol resin, a novolac resin, an acrylic resin, a melamine resin, or a urethane resin is used. As a manufacturing method of the partition walls 780 and 782, a vapor deposition method such as plasma CVD or thermal CVD, or sputtering may be used. In addition, droplet discharging or printing can be employed. Furthermore, a film obtained by a coating method, or the like may be used as the partition walls 780 and 782.

Figure 11:
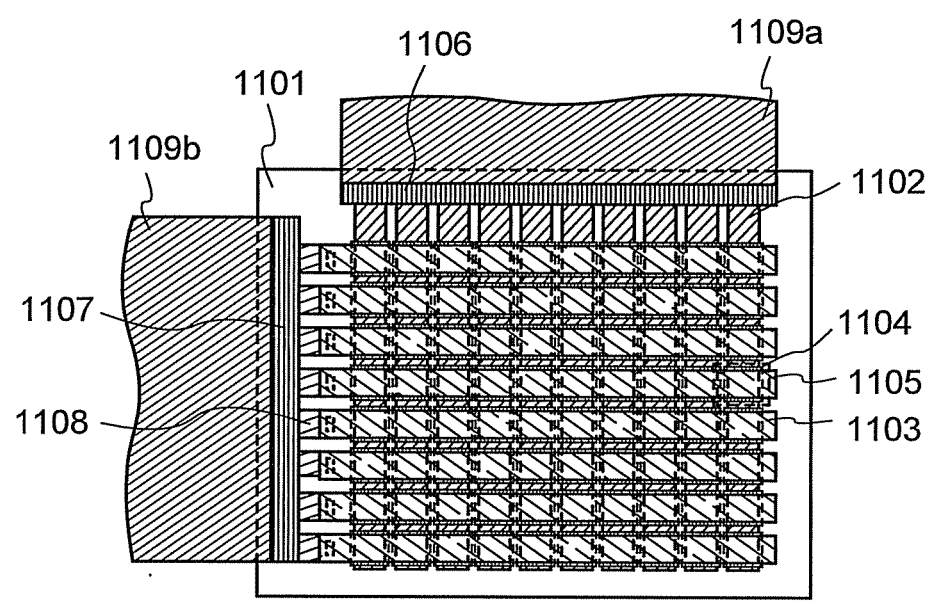
FIG. 11 is a cross-sectional view illustrating a light-emitting display module.

FIG. 11 is a top view of the passive matrix light-emitting device illustrated in FIGS. 8A to 8C, on which an FPC and the like are mounted.

In FIG. 11, scan lines and data lines perpendicularly intersect with each other in a pixel portion for displaying images.

The first electrode layers 751a, 751b, and 751c in FIGS. 8A to 8C correspond to data lines 1102 in FIG. 11, and the second electrode layers 753a, 753b, and 753c in FIGS. 8A to 8C correspond to scan lines 1103 in FIG. 11. The EL layers 752a, 752b, and 752c in FIGS. 8A to 8C correspond to EL layers 1104 in FIG. 11. The EL layers 1104 in FIG. 11 are sandwiched between the data lines 1102 and the scan lines 1103, and an intersection indicated by a region 1105 corresponds to one pixel (indicated by the light-emitting element 750 in FIGS. 8A and 8B).

Note that ends of the scan lines 1103 are electrically connected to a connection wiring 1108, and the connection wiring 1108 is connected to an FPC 1109b through an input terminal 1107. The data lines are connected to an FPC 1109a through an input terminal 1106.

In addition, a polarizing plate, a circularly polarizing plate (including an elliptically polarizing plate), a retardation plate (a quarter-wave plate or a half-wave plate), or an optical film such as a color filter may be provided as appropriate over a light-emitting surface. Furthermore, the polarizing plate or the circularly polarizing plate may be provided with an anti-reflection film. For example, anti-glare treatment may be carried out by which reflected light can be diffused by surface roughness so as to reduce glare.

Although FIG. 11 illustrates an example in which a driver circuit is not provided over the substrate, there is no particular limitation on the position of the driver circuit. An IC chip including a driver circuit may be mounted on the substrate.

In the case where an IC chip is mounted, a data line side IC and a scan line side IC, each of which includes a driver circuit for transmitting each signal to the pixel portion, are mounted on the periphery of (outside of) the pixel portion by COG (chip on glass). The mounting may be performed by TCP or wire bonding other than COG A TCP is a TAB (tape automated bonding) tape on which an IC is mounted, and the IC is mounted by connecting the TAB tape to a wiring over an element-formation substrate. Each of the data line side IC and the scan line side IC may be formed using a single crystal silicon substrate. Alternatively, a driver circuit may be formed using TFTs over a glass substrate, a quartz substrate, or a plastic substrate. An example in which a single IC is provided on one side is described here; however, a plurality of ICs may be provided on one side.

Note that a partition wall is not necessarily provided in a passive matrix light-emitting device. Also in this case, an EL layer provided between a first electrode layer and a second electrode layer can be selectively formed to a uniform thickness using the deposition method disclosed in this specification.

A thin film can be formed in a fine pattern on a deposition-target substrate without providing a mask between a material and the deposition-target substrate. By forming the light-emitting element by such a deposition method as described in this embodiment, a highly reliable light-emitting device can be manufactured.

This embodiment can be combined with any of Embodiments 1 and 3 as appropriate.

Embodiment 5

In this embodiment, an active matrix light-emitting device manufactured using the deposition substrate and the deposition method which are disclosed in this specification will be described with reference to FIGS. 12A and 12B.

FIG. 12A is a top view of a light-emitting device and FIG. 12B is a cross-sectional view taken along lines A-B and C-D of FIG. 12A. Reference numeral 601 denoted by a dashed line indicates a driver circuit portion (a source driver circuit); 602, a pixel portion; and 603, a driver circuit portion (a gate driver circuit). Further, reference numeral 604 indicates a sealing substrate and reference numeral 605 indicates a sealing material. A space 607 is provided inside a portion surrounded by the sealing material 605.

A lead wiring 608 is a wiring for transmitting signals to be inputted to the source driver circuit 601 and the gate driver circuit 603, and receives video signals, clock signals, start signals, reset signals, and the like from an FPC (flexible printed circuit) 609 that serves as an external input terminal. Although only the FPC is illustrated here, this FPC may be provided with a printed wiring board (PWB). The light-emitting device in this specification refers not only to a light-emitting device itself but also to a light-emitting device to which an FPC or a PWB is attached.

Next, the cross-sectional structure of the light-emitting device is described with reference to FIG. 12B. The driver circuit portions and the pixel portion are provided over an element substrate 610; however, FIG. 12B illustrates only the source driver circuit 601 included in the driver circuit portions and one pixel in the pixel portion 602.

Note that as the source driver circuit 601, a CMOS circuit combining an N-channel transistor 623 and a P-channel transistor 624 is formed. Alternatively, the driver circuit may include various CMOS circuits, PMOS circuits, or NMOS circuits. Although this embodiment illustrates a driver-integrated type in which the driver circuits are formed over the substrate, the driver circuits are not necessarily formed over the substrate, but may be formed outside the substrate.

The pixel portion 602 has a plurality of pixels each provided with a switching transistor 611, a current-controlling transistor 612, and a first electrode 613 electrically connected to a drain of the current-controlling transistor 612. Note that an insulating layer 614 is formed to cover the end portion of the first electrode 613. Here, the insulating layer 614 is formed using a positive photosensitive acrylic resin film. The first electrode 613 is formed over an insulating layer 619 that is an interlayer insulating layer.

In order to improve the coverage, the insulating layer 614 is formed so as to have a curved surface with a curvature at either an upper end portion or a lower end portion. For example, in the case of using a positive photosensitive acrylic film for the insulating layer 614, it is preferable that the insulating layer 614 have a curved surface with a curvature radius (0.2 µm to 3 µm) only at the upper end portion. Alternatively, the insulating layer 614 may be formed using either negative photosensitive acrylic that becomes insoluble in an etchant after light irradiation, or positive photosensitive acrylic that becomes dissoluble in an etchant after light irradiation.

There is no particular limitation on the structure of the transistor. The transistor may have a single-gate structure including one channel formation region, a double-gate structure including two channel formation regions, or a triple-gate structure including three channel formation regions. Furthermore, a transistor on the periphery of the driver circuit region may also have a single-gate structure, a double-gate structure, or a triple-gate structure.

The transistor may have a top-gate structure (e.g., a staggered structure or a coplanar structure), a bottom-gate structure (e.g., an inverted-coplanar structure), a dual-gate structure including two gate electrode layers provided over and under a channel region each with a gate insulating film interposed therebetween, or other structures.

In addition, there is no particular limitation on the crystallinity of a semiconductor used for the transistor. The semiconductor layer can be formed using the following materials: an amorphous semiconductor formed by sputtering or a vapor-phase growth method using a semiconductor source gas typified by silane or germane; a polycrystalline semiconductor formed by crystallizing the amorphous semiconductor by utilizing light energy or thermal energy; a single crystal semiconductor; and the like.

The amorphous semiconductor is typified by hydrogenated amorphous silicon, and the crystalline semiconductor is typified by polysilicon or the like. Polysilicon (polycrystalline silicon) includes so-called high-temperature polysilicon that contains as its main component polysilicon formed at a process temperature of 800° C. or more, so-called low-temperature polysilicon that contains as its main component polysilicon formed at a process temperature of 600° C. or less, and polysilicon formed by crystallizing amorphous silicon by using, for example, an element that promotes crystallization. Instead of such a thin film process, an SOI substrate in which a single crystal semiconductor layer is provided on an insulating surface may be used. The SOI substrate can be formed by a separation by implanted oxygen (SIMOX) method or a Smart-Cut (registered trademark) method. In the SIMOX method, after oxygen ions are implanted into a single crystal silicon substrate to form an oxygen-containing layer at a predetermined depth, heat treatment is performed, an embedded insulating layer is formed at a predetermined depth from the surface of the single crystal silicon substrate, and a single crystal silicon layer is formed over the embedded insulating layer. In the Smart-Cut (registered trademark) method, hydrogen ions are implanted into an oxidized single crystal silicon substrate to faun a hydrogen-containing layer at a predetermined depth, the oxidized single crystal silicon substrate is attached to another supporting substrate (e.g., a single crystal silicon substrate having a surface provided with a silicon oxide film for bonding), and heat treatment is performed, whereby the single crystal silicon substrate is separated at the hydrogen-containing layer to form a stack including the silicon oxide film and the single crystal silicon layer on the supporting substrate.

An EL layer 616 and a second electrode 617 are formed over the first electrode 613. The EL layer 616 of the light-emitting element illustrated in this embodiment can be formed by the deposition method shown in Embodiment 1.

The sealing substrate 604 and the element substrate 610 are attached to each other with the sealing material 605, whereby a light-emitting element 618 is provided in the space 607 surrounded by the element substrate 610, the sealing substrate 604, and the sealing material 605. Note that the space 607 is filled with an inert gas (nitrogen, argon, or the like) or a filler such as the sealing material 605.

As the sealing material 605, a visible-light curing resin, an ultraviolet curing resin, or a thermosetting resin is preferably used. Specifically, an epoxy resin can be used. In addition, it is preferable to use a material that prevents penetration of moisture or oxygen as much as possible. As the sealing substrate 604, a plastic substrate made of FRP (Fiberglass-Reinforced Plastics), PVF (polyvinyl fluoride), polyester, acrylic, or the like can be used as well as a glass substrate or a quartz substrate. Alternatively, a film (made of polypropylene, polyester, vinyl, polyvinyl fluoride, vinyl chloride, or the like), or an inorganic evaporated film may be used.

An insulating layer may be provided as a passivation film (a protective film) over the light-emitting element. As the passivation film, it is possible to use a single layer or stacked layers of an insulating film containing silicon nitride, silicon oxide, silicon oxynitride, silicon nitride oxide, aluminum nitride, aluminum oxynitride, aluminum nitride oxide containing more nitrogen than oxygen, aluminum oxide, diamond-like carbon (DLC), or nitrogen-containing carbon. Alternatively, a siloxane resin may be used.

Instead of the filler, nitrogen or the like may be encapsulated by sealing in a nitrogen atmosphere. In the case where light is extracted from the light-emitting device through the filler, the filler needs to transmit light. As the filler, a visible-light curing epoxy resin, an ultraviolet curing epoxy resin, or a thermosetting epoxy resin may be used. The filler may be dripped in a liquid state to fill the space in the light-emitting device. When a hygroscopic substance such as a desiccant is used as the filler, or a hygroscopic substance is added to the filler, a higher moisture-absorbing effect can be achieved and deterioration of elements can be prevented.

In addition, a retardation plate or a polarizing plate may be used to block the reflection of external incident light. An insulating layer serving as a partition wall may be colored to be used as a black matrix. This partition wall can be formed by droplet discharging with the use of carbon black or the like mixed into a resin material such as polyimide, and a stack thereof may also be used. By droplet discharging, different materials may be discharged to the same region plural times to form a partition wall. As the retardation plate, a quarter-wave plate and a half-wave plate may be used to control light. As the structure, the element substrate, the light-emitting element, the sealing substrate (the sealing material), the retardation plates (a quarter-wave plate and a half-wave plate), and the polarizing plate are provided in this order, and light emitted from the light-emitting element passes therethrough and is emitted to the outside from the polarizing plate side. The retardation plates and the polarizing plate may be provided on a side from which light is emitted, and may be provided on both sides in the case of a dual-emission light-emitting device in which light is emitted from the both sides. In addition, an anti-reflection film may be provided outside the polarizing plate. Accordingly, higher-resolution and more precise images can be displayed.

Although the aforementioned circuit is used in this embodiment, this embodiment is not limited thereto and an IC chip may be mounted as a peripheral driver circuit by the aforementioned COG or TAB. Furthermore, the number of gate driver circuits and source driver circuits is not especially limited.

In the light-emitting device, a driving method for displaying images is not particularly limited, and for example, a dot-sequential driving method, a line-sequential driving method, an area-sequential driving method, or the like may be used. Typically, the line-sequential driving method is used, and a time-division gray scale driving method or an area gray scale driving method may be used as appropriate. Furthermore, an image signal inputted to the source line of the light-emitting device may be either an analog signal or a digital signal. The driver circuit and the like may be designed as appropriate depending on the image signal.

The light-emitting layer may have a structure in which light-emitting layers having different wavelength ranges are formed in respective pixels so that color display is performed. Typically, light-emitting layers corresponding to R (red), G (green), and B (blue) are formed. Also in that case, a filter transmitting light of a wavelength range may be provided on the side of a pixel from which light is emitted, whereby color purity can be improved and a pixel region can be prevented from having a mirror surface (reflecting). By providing the filter, the loss of light emitted from the light-emitting layer can be eliminated. Furthermore, it is possible to reduce a change in color tone, which occurs when the pixel region (a display screen) is seen from an oblique angle.

A thin film can be formed in a fine pattern on a deposition-target substrate without providing a mask between a material and the deposition-target substrate. By forming the light-emitting element by such a deposition method as described in this embodiment, a highly reliable light-emitting device can be manufactured.

This embodiment can be combined with any of Embodiments 1 to 4 as appropriate.

Embodiment 6

By applying the deposition substrate, the deposition method, and the method for manufacturing a light-emitting device which are disclosed in this specification, light-emitting devices having a variety of display functions can be manufactured. That is, the deposition substrate, the deposition method, and the method for manufacturing a light-emitting device which are disclosed in this specification can be applied to various electronic devices in which the light-emitting device having a display function is incorporated in a display portion.

Examples of such electronic devices are as follows: a television device (also simply referred to as a television or a television receiver), a camera such as a digital camera or a digital video camera, a cellular telephone device (also simply referred to as a cellular phone or a cell-phone), a portable information terminal such as a PDA, a portable game machine, a computer monitor, a computer, a sound reproducing device such as a car audio system, an image reproducing device including a recording medium (specifically, a digital versatile disc (DVD)), such as a home-use game machine, and the like. Furthermore, the deposition substrate, the deposition method, and the method for manufacturing a light-emitting device which are disclosed in this specification can be applied to any game machine having a light-emitting device, such as a pachinko machine, a slot machine, a pinball machine, a large-scale game machine, and the like. Specific examples will be described with reference to FIGS. 13A to 13F and FIGS. 14A and 14B.

The application range of the light-emitting device disclosed in this specification is so wide that the light-emitting device can be applied to electronic devices of various fields. By using the deposition method described in Embodiment 1, highly reliable electronic devices which has a large display portion or lighting portion can be provided at low cost.

Figure 13A:
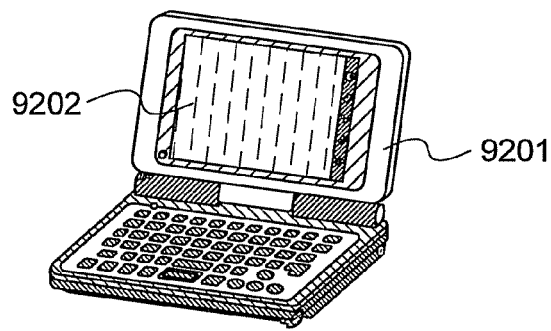
FIGS. 13A to 13F are views illustrating electronic devices.

A portable information terminal device illustrated in FIG. 13A includes a main body 9201, a display portion 9202, and the like. The light-emitting device disclosed in this specification can be applied to the display portion 9202. As a result, a highly reliable portable information terminal device can be provided at low cost.

Figure 13B:
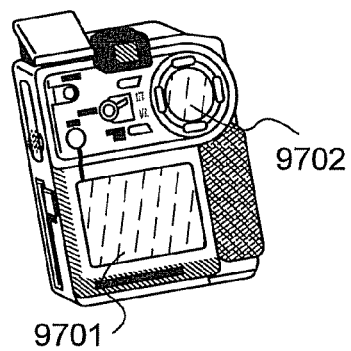

A digital video camera illustrated in FIG. 13B includes a display portion 9701, a display portion 9702, and the like. The light-emitting device disclosed in this specification can be applied to the display portion 9701. As a result, a highly reliable digital video camera can be provided at low cost.

Figure 13C:
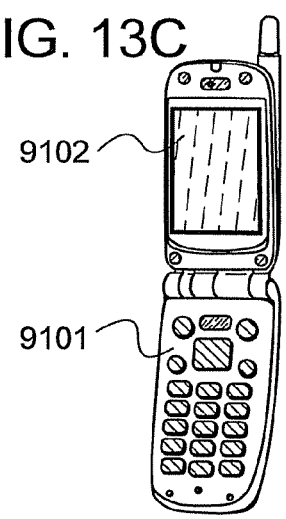

A cellular phone illustrated in FIG. 13C includes a main body 9101, a display portion 9102, and the like. In addition to the above-described structure, a wireless IC chip, a small size memory device, or the like can be built in the cellular phone. Further, the cellular phone may also have an infrared communication function, a television reception function, or the like. The light-emitting device disclosed in this specification can be applied to the display portion 9102. As a result, a highly reliable cellular phone can be provided at low cost.

Figure 13D:
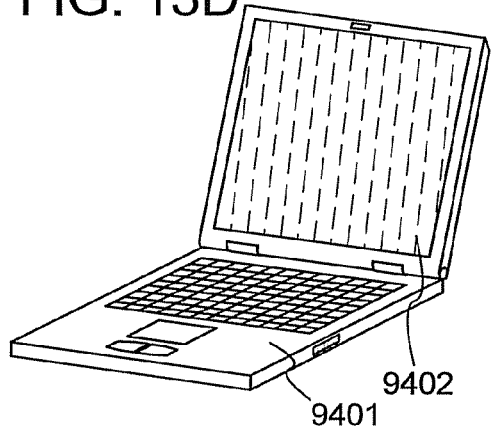
Figure 13E:
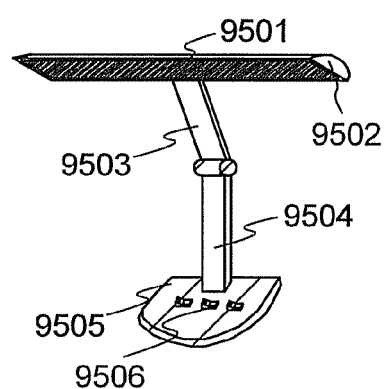

A portable computer illustrated in FIG. 13D includes a main body 9401, a display portion 9402, and the like. The light-emitting device disclosed in this specification can be applied to the display portion 9402. As a result, a highly reliable portable computer can be provided at low cost.

The light-emitting device disclosed in this specification can also be applied to a small-size desk lamp or a large-size indoor lighting device. A desk lamp illustrated in FIG. 13E includes a lighting portion 9501, a shade 9502, an adjustable arm 9503, a support 9504, a base 9505, and a power source 9506. The light-emitting device disclosed in this specification can be applied to the lighting portion 9501. Note that the lighting device includes a ceiling light, a wall light, and the like. A large-size lighting device can be provided at low cost.

Furthermore, the light-emitting device disclosed in this specification can be used as a backlight of a liquid crystal display device. Since the light-emitting device disclosed in this specification is a lighting device with planar light emission and can be increased in area the area of the backlight can be increased, resulting in the liquid crystal display device with a larger area. In addition, the light-emitting device disclosed in this specification has a small thickness; thus, the thickness of the liquid crystal display device can also be reduced.

Figure 13F:
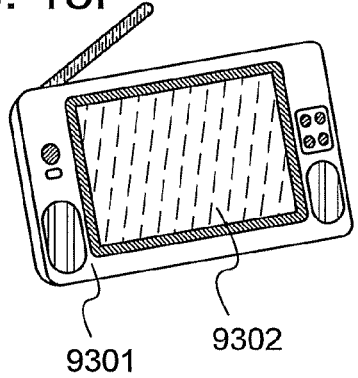

A portable television device illustrated in FIG. 13F includes a main body 9301, a display portion 9302, and the like. The light-emitting device disclosed in this specification can be applied to the display portion 9302. As a result, a portable television device with high-image quality can be provided at low cost. Furthermore, the light-emitting device disclosed in this specification can be applied to a wide range of television devices: small devices installed in portable terminals such as cellular phones; mid-sized devices that can be picked up and carried; and large-sized devices (for example, 40-inch displays and above).

Figure 14A:
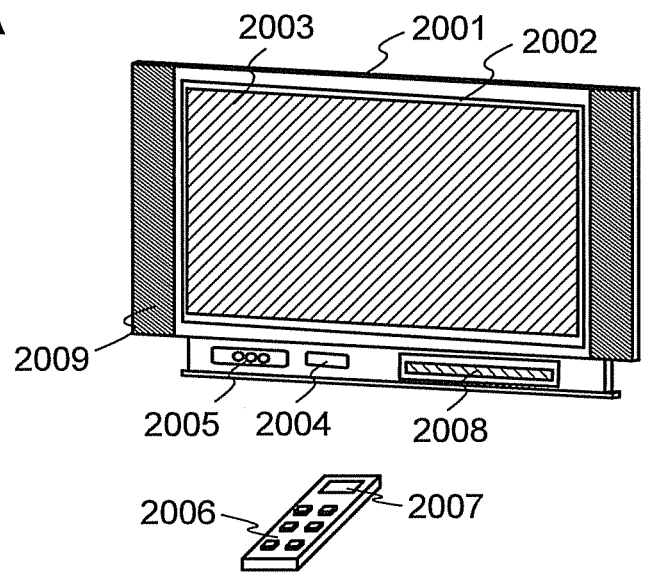
FIGS. 14A and 14B are views illustrating electronic devices.

FIG. 14A illustrates a television device having a large-size display portion. The light-emitting device disclosed in this specification can be applied to a main screen 2003. The television device also includes a speaker portion 2009, operation switches, and the like. In such a manner, a television device can be completed.

As illustrated in FIG. 14A, a display panel 2002 using a light-emitting element is incorporated in a housing 2001. The television device can receive general TV broadcast with a receiver 2005. When the television device is connected to a communication network by wired or wireless connections via a modem 2004, one-way (from a sender to a receiver) or two-way (between a sender and a receiver or between receivers) information communication can also be performed. The television device can be operated by a switch built in the housing, or a remote control unit 2006 that is provided separately. The remote control unit 2006 may also have a display portion 2007 for displaying information to be outputted.

The television device may also include a sub screen 2008 formed using a second display panel in addition to the main screen 2003, so that channels, sound volume, and the like are displayed.

Figure 14B:
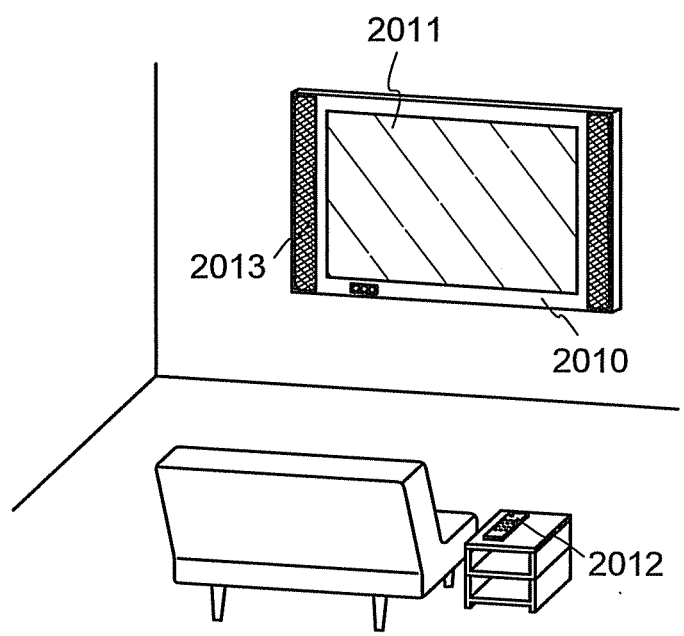

FIG. 14B illustrates a television device having a large-size display portion, for example, a 20-inch to 80-inch display portion. The television device includes a housing 2010, a display portion 2011, a remote control unit 2012 that is an operation portion, a speaker portion 2013, and the like. The light-emitting device disclosed in this specification is applied to the display portion 2011. A highly reliable large-size television device can be provided at low cost. The television device illustrated in FIG. 14B is a wall-hanging type, and does not require a large installation space.

Needles to say, the light-emitting device disclosed in this specification can be applied to various applications, particularly to large-size display media such as an information board at train stations, airports, or the like, or an advertising display screen on the street.

This embodiment can be combined with any of Embodiments 1 to 5 as appropriate.

Example 1

A thin film is deposited using a deposition substrate in which a surface of a light-absorbing portion is made into a rough surface with unevenness, and the thin film was evaluated. As the present example, the result of the thickness distribution of thin films formed onto a deposition substrate and a deposition-target substrate is described.

Figure 15:
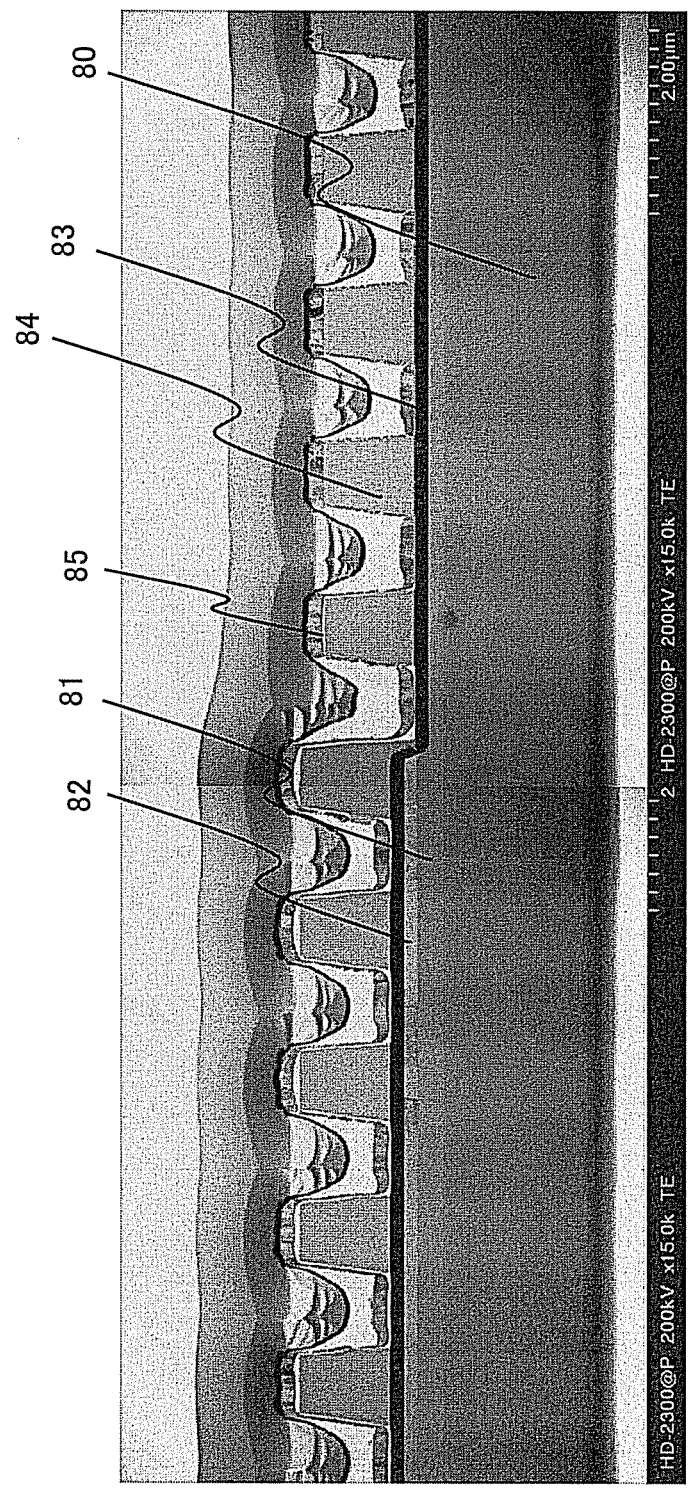
FIG. 15 is a STEM image of a deposition substrate of an example.

The end face of a deposition substrate of the present example was cut out by using a focused ion beam (FIB), and the cross section was observed by using a scanning transmission electron microscope (STEM; HD-2300 made by Hitachi, Ltd.,) at a magnification of 15000 times with the acceleration voltage set to 200 kV. FIG. 15 is a photograph showing the cross section.

A silicon oxide film (with a thickness of 300 nm) was formed as a base film 81 over a glass substrate 80 by sputtering, and an aluminum film (300 nm) was selectively formed as reflective layers 82 over the base film 81 by sputtering. A titanium film (with a thickness of 300 nm) was formed as a light-absorbing film 83 over the base film 81 and the reflective layers 82, and a plurality of projections 84 were formed over the light-absorbing film 83. The light-absorbing film 83 and the projections 84 form a light-absorbing portion with unevenness. The projections 84 were formed by depositing a silicon oxynitride film (with a thickness of 1000 nm) by CVD and processing it into projections by etching. Note that in the photograph of FIG. 15 showing the cross section, the width of each projection 84 is 700 nm and the distance between the central portion of the projection 84 and the central portion of adjacent projection 84 is 1.5 μm. An organic compound-containing layer 85 was formed to a thickness of 50 nm as a material layer over the projections 84 by a co-evaporation method.

Formula 1 is the structural formulae of 9-[4-(N-carbazolyl)]phenyl-10-phenylanthracene (abbreviation: CzPA) and 9,10-diphenyl-2-[N-phenyl-N-(9-phenyl-9H-carbazol-3-yl)amino]anthracene (abbreviation: 2PCAPA) which are used for the organic compound-containing layer 85. Note that 2PCAPA in a CzPA:2PCAPA film was set to 6 wt %.

[Formula 1]

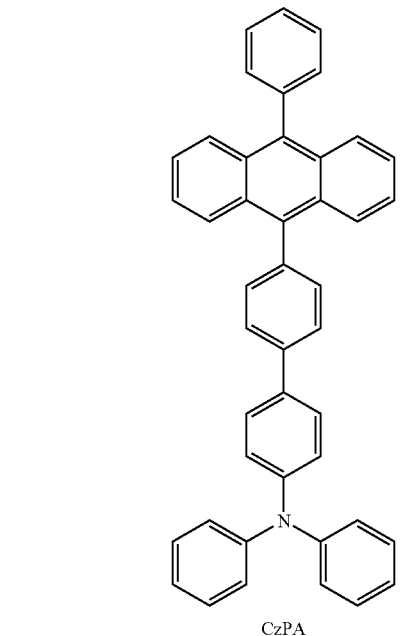

CzPA

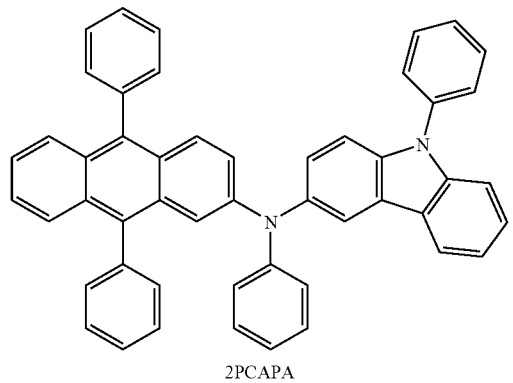

2PCAPA

As a comparative example, a deposition substrate was manufactured by forming an organic compound-containing layer 85 over a light-absorbing film 83 in which the number of projections 83 was smaller than the above example and which was substantially flat. Note that other components of the comparative example were formed in a manner similar to that of the present example; therefore, the detailed description thereof is omitted.

The deposition substrate of each of the present and the comparative examples was irradiated with light, whereby a thin film (a CzPA:2PCAPA film) was deposited onto a deposition-target substrate. The light irradiation conditions are as follows: a laser of a wavelength of 532 nm is used as a light source; an output power is 10 W; the irradiation time is 0.2 msec; and the movement speed of a stage on which the deposition substrate is placed is 500 mm/sec.

Figure 16:
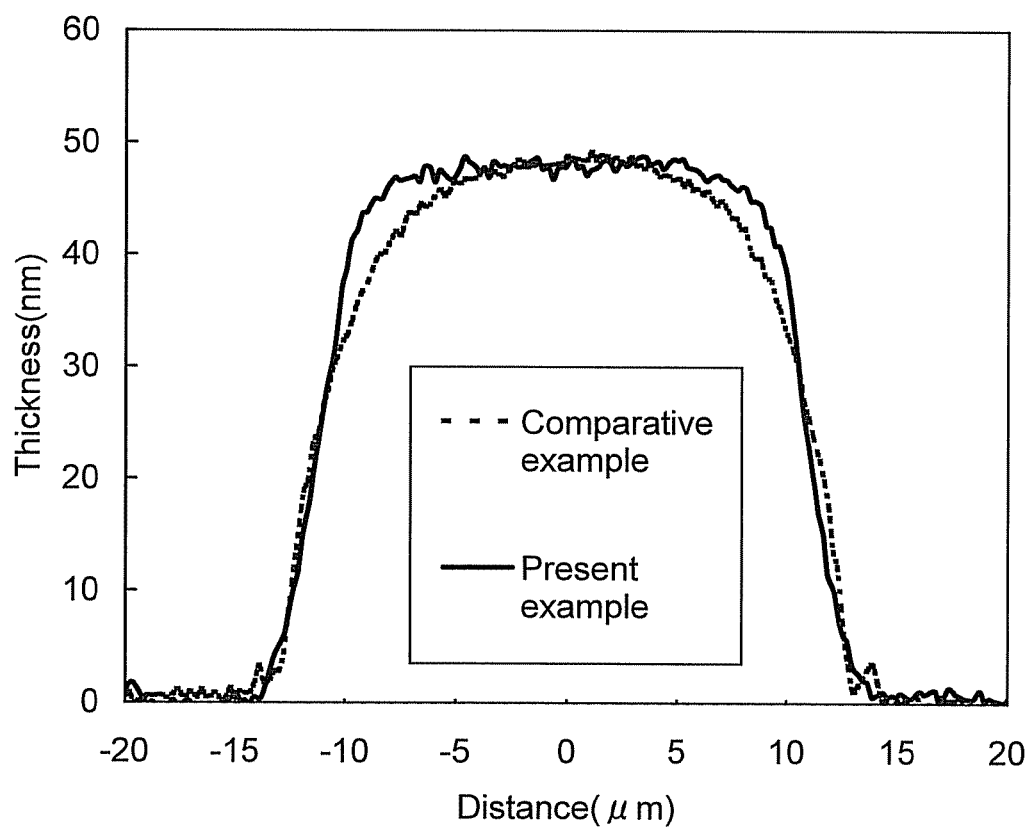
FIG. 16 is a graph illustrating thickness distribution of thin films formed using deposition substrates of an example and a comparative example.

FIG. 16 is a graph showing the thickness distributions of the thin films of the present example and the comparative example which are formed on the deposition-target substrates. In FIG. 16, the result of the thin film of the present example is denoted by a solid line, and the result of the thin film of the comparative example is denoted by a dotted line.

The horizontal axis represents the distance when a central portion of the CzPA:2PCAPA film obtained is regarded as 0 (although the right direction of the graph is positive and the left direction of the graph is negative for convenience of the graph creation, the values are actually absolute values), and the vertical axis represents the thickness. As for the thin film of the comparative example, the film thickness of the end portion changes moderately, and a graph line showing the thicknesses of the end portion thereof provides a gentler slope. In contrast, as for the thin film of the present example, the film thickness of the end portion changes rapidly more. This shows that the improper shape due to so-called deformed patterns is improved.

Therefore, in the deposition substrate and the deposition method of the present example, it is confirmed that an organic compound material melted by heating using light is not flocculated because the organic-compound material is over a rough surface with unevenness and thus a thin film with a uniform thickness can be deposited in a pattern with more accurate shape onto a deposition-target substrate.

This application is based on Japanese Patent Application serial no. 2008-270293 filed with Japan Patent Office on Oct. 20, 2008, the entire contents of which are hereby incorporated by reference.

What is claimed is:

1. A method for manufacturing a light-emitting device comprising the steps of:
   forming a light-absorbing layer including an unevenness portion over a first substrate, wherein the light-absorbing layer includes a first layer and a second layer, and wherein one of the first layer and the second layer includes the unevenness portion;
   forming a first organic compound layer over the light-absorbing layer;
   providing a second substrate over the first substrate with the light-absorbing layer and the first organic compound layer interposed therebetween; and
   irradiating the light-absorbing layer with light to deposit a second organic compound layer including a material contained in the first organic compound layer onto the second substrate.

2. A method for manufacturing a light-emitting device according to claim 1, wherein the light-absorbing layer includes any one of titanium nitride, tantalum nitride, molybdenum nitride, tungsten nitride, titanium, molybdenum, tungsten, or carbon.

3. A method for manufacturing a light-emitting device according to claim 1, wherein the unevenness portion includes column-like or cone-like projection portions.

4. A method for manufacturing a light-emitting device according to claim 1, wherein a difference in height between a depression of the unevenness portion and a projection of the unevenness portion is from 500 nm to 2000 nm.

5. A method for manufacturing a light-emitting device according to claim 1, further comprising a reflective layer disposed between the first substrate and the light-absorbing layer.

6. A method for manufacturing a light-emitting device according to claim 1, further comprising a heat-insulating layer disposed between the first substrate and the light-absorbing layer.

7. A method for manufacturing a light-emitting device comprising the steps of:
   forming a light-absorbing layer including an unevenness portion over a first substrate, wherein the light-absorbing layer includes a first layer and a second layer, and wherein one of the first layer and the second layer includes the unevenness portion;
   forming a first organic compound layer over the light-absorbing layer;
   providing a second substrate over the first substrate with the light-absorbing layer and the first organic compound layer interposed therebetween; and
   irradiating the light-absorbing layer with light to vaporize a material contained in the first organic compound layer and to deposit a second organic compound layer including the material contained in the first organic compound layer onto the second substrate.

8. A method for manufacturing a light-emitting device according to claim 7, wherein the light-absorbing layer includes any one of titanium nitride, tantalum nitride, molybdenum nitride, tungsten nitride, titanium, molybdenum, tungsten, or carbon.

9. A method for manufacturing a light-emitting device according to claim 7, wherein the unevenness portion includes column-like or cone-like projection portions.

10. A method for manufacturing a light-emitting device according to claim 7, wherein a difference in height between a depression of the unevenness portion and a projection of the unevenness portion is from 500 nm to 2000 nm.

11. A method for manufacturing a light-emitting device according to claim 7, further comprising a reflective layer disposed between the first substrate and the light-absorbing layer.

12. A method for manufacturing a light-emitting device according to claim 7, further comprising a heat-insulating layer disposed between the first substrate and the light-absorbing layer.

13. A method for manufacturing a light-emitting device comprising the steps of:
   forming a light-absorbing layer including an unevenness portion over a first substrate;
   forming a first organic compound layer over the light-absorbing layer;
   providing a second substrate over the first substrate with the light-absorbing layer and the first organic compound layer interposed therebetween; and
   irradiating the light-absorbing layer with light to vaporize a material contained in the first organic compound layer and to deposit a second organic compound layer including the material contained in the first organic compound layer onto the second substrate,
   wherein the material contained in the first organic compound layer is melted and flows into each depressions of the unevenness portion when the light is irradiated to the light-absorbing layer.

14. A method for manufacturing a light-emitting device according to claim 13, wherein the light-absorbing layer includes any one of titanium nitride, tantalum nitride, molybdenum nitride, tungsten nitride, titanium, molybdenum, tungsten, or carbon.

15. A method for manufacturing a light-emitting device according to claim 13, wherein the unevenness portion includes column-like or cone-like projection portions.

16. A method for manufacturing a light-emitting device according to claim 13, wherein a difference in height between a depression of the unevenness portion and a projection of the unevenness portion is from 500 nm to 2000 nm.

17. A method for manufacturing a light-emitting device according to claim 13, wherein the light-absorbing layer includes a first layer and a second layer, and wherein one of the first layer and the second layer includes the unevenness portion.

18. A method for manufacturing a light-emitting device according to claim 13, further comprising a reflective layer disposed between the first substrate and the light-absorbing layer.

19. A method for manufacturing a light-emitting device according to claim 13, further comprising a heat-insulating layer disposed between the first substrate and the light-absorbing layer.

* * * * *

UNITED STATES PATENT AND TRADEMARK OFFICE
CERTIFICATE OF CORRECTION

| | |
|---|---|
| PATENT NO. | : 8,486,736 B2 |
| APPLICATION NO. | : 12/579067 |
| DATED | : July 16, 2013 |
| INVENTOR(S) | : Kohei Yokoyama et al. |

It is certified that error appears in the above-identified patent and that said Letters Patent is hereby corrected as shown below:

In the Specification:

Column 2, line 39; Change "be faulted on" to --be formed on--.
Column 11, line 32; Change "of fainting the" to --of forming the--.
Column 13, line 26; Change "a undo, in thickness" to --a uniform thickness--.
Column 23, line 61; Change "is foamed in" to --is formed in--.
Column 27, line 39; Change "an SOT substrate" to --an SOI substrate--.
Column 27, line 41; Change "The SOT substrate" to --The SOI substrate--.
Column 27, line 52; Change "to faun a" to --to form a--.

Signed and Sealed this
Twenty-ninth Day of October, 2013

Teresa Stanek Rea
*Deputy Director of the United States Patent and Trademark Office*